United States Patent
Mukherjee et al.

(10) Patent No.: US 10,897,009 B2
(45) Date of Patent: Jan. 19, 2021

(54) RESISTIVE MEMORY CELLS AND PRECURSORS THEREOF, METHODS OF MAKING THE SAME, AND DEVICES INCLUDING THE SAME

(71) Applicant: INTEL CORPORATION, Santa Clara, CA (US)

(72) Inventors: Niloy Mukherjee, Portland, OR (US); Ravi Pillarisetty, Portland, OR (US); Prashant Majhi, San Jose, CA (US); Uday Shah, Portland, OR (US); Ryan E Arch, Hillsboro, OR (US); Markus Kuhn, Hillsboro, OR (US); Justin S. Brockman, Portland, OR (US); Huiying Liu, Portland, OR (US); Elijah V Karpov, Portland, OR (US); Kaan Oguz, Portland, OR (US); Brian S. Doyle, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/414,956

(22) Filed: May 17, 2019

(65) Prior Publication Data
US 2019/0348604 A1    Nov. 14, 2019

Related U.S. Application Data

(63) Continuation of application No. 15/529,907, filed as application No. PCT/US2014/072330 on Dec. 24, 2014, now Pat. No. 10,516,109.

(51) Int. Cl.
*H01L 45/00*    (2006.01)

(52) U.S. Cl.
CPC .......... *H01L 45/1633* (2013.01); *H01L 45/08* (2013.01); *H01L 45/126* (2013.01);
(Continued)

(58) Field of Classification Search
CPC ... H01L 45/1633; H01L 45/08; H01L 45/126; H01L 45/145; H01L 45/1608; H01L 45/1616
See application file for complete search history.

(56) References Cited

U.S. PATENT DOCUMENTS

| 8,212,232 B2 | 7/2012 | Lee |
| 8,362,454 B2 | 1/2013 | Lee et al. |

(Continued)

FOREIGN PATENT DOCUMENTS

TW    201007939    2/2010

OTHER PUBLICATIONS

European Search Report from related application EP14908597.9 dated May 31, 2019.
(Continued)

*Primary Examiner* — Fernando L Toledo
*Assistant Examiner* — Valerie N Newton
(74) *Attorney, Agent, or Firm* — Schwabe, Williamson & Wyatt, P.C.

(57) ABSTRACT

Resistive memory cells, precursors thereof, and methods of making resistive memory cells are described. In some embodiments, the resistive memory cells are formed from a resistive memory precursor that includes a switching layer precursor containing a plurality of oxygen vacancies that are present in a controlled distribution therein, optionally without the use of an oxygen exchange layer. In these or other embodiments, the resistive memory precursors described may include a second electrode formed on a switching layer precursor, wherein the second electrode is includes a second (Continued)

electrode material that is conductive but which does not substantially react with oxygen. Devices including resistive memory cells are also described.

9 Claims, 16 Drawing Sheets

(52) U.S. Cl.
CPC ........ *H01L 45/145* (2013.01); *H01L 45/1608* (2013.01); *H01L 45/1616* (2013.01)

(56) References Cited

U.S. PATENT DOCUMENTS

| | | | |
|---|---|---|---|
| 8,819,335 | B1 | 8/2014 | Salessi et al. |
| 8,883,557 | B1 | 11/2014 | Hsueh et al. |
| 9,484,087 | B2 | 11/2016 | Lee |
| 9,653,680 | B2 | 5/2017 | Pillarisetty |
| 10,516,109 | B2 * | 12/2019 | Mukherjee .......... H01L 45/1616 |
| 2010/0019219 | A1 | 1/2010 | Lee |
| 2010/0110758 | A1 | 5/2010 | Li et al. |
| 2010/0178729 | A1 | 7/2010 | Yoon et al. |
| 2010/0258782 | A1 * | 10/2010 | Kuse .................... H01L 45/146 257/4 |
| 2010/0314602 | A1 | 12/2010 | Kensuke et al. |
| 2011/0073828 | A1 | 3/2011 | Xia et al. |
| 2011/0155989 | A1 | 6/2011 | Park et al. |
| 2012/0054236 | A1 | 3/2012 | Branscome et al. |
| 2012/0112153 | A1 | 5/2012 | Ninomiya et al. |
| 2012/0267637 | A1 | 10/2012 | Jeon et al. |
| 2012/0280201 | A1 | 11/2012 | Sekar et al. |
| 2012/0313069 | A1 | 12/2012 | Wang et al. |
| 2013/0009122 | A1 | 1/2013 | Park et al. |
| 2013/0010529 | A1 | 1/2013 | Hayakawa et al. |
| 2013/0021835 | A1 | 1/2013 | Hwang et al. |
| 2013/0069031 | A1 | 3/2013 | Huang et al. |
| 2013/0193397 | A1 | 8/2013 | Lin et al. |
| 2013/0248804 | A1 | 9/2013 | Kawai |
| 2014/0008602 | A1 | 1/2014 | Karpov et al. |
| 2014/0061568 | A1 | 3/2014 | Ramaswamy et al. |
| 2014/0175363 | A1 * | 6/2014 | Tendulkar ............... H01L 45/08 257/4 |
| 2014/0175371 | A1 | 6/2014 | Karpov et al. |
| 2014/0197368 | A1 * | 7/2014 | Yoneda .................. H01L 45/08 257/2 |
| 2014/0246643 | A1 | 9/2014 | Kim et al. |
| 2014/0264247 | A1 | 9/2014 | Daryanani et al. |
| 2014/0322885 | A1 | 10/2014 | Xie et al. |
| 2016/0359108 | A1 | 12/2016 | Majhi et al. |

OTHER PUBLICATIONS

China Office Action from related matter CN201480083609/8 dated Dec. 5, 2019, with English translation.
Office Action for Chinese Patent Application No. 201480083609 dated Sep. 9, 2020, 8 pgs., no. translation.
Office Action from Taiwan Patent Application No. 104138555, dated Nov. 19, 2020, 10 pages.

* cited by examiner

RESISTIVE MEMORY CELLS AND PRECURSORS THEREOF, METHODS OF MAKING THE SAME, AND DEVICES INCLUDING THE SAME

CROSS-REFERENCE TO RELATED APPLICATIONS

This application is a continuation of U.S. patent application Ser. No. 15/529,907, filed on May 25, 2017, which is a is a U.S. National Phase application under 35 U.S.C. 0 371 of International Application No. PCT/US14/72330, filed Dec. 24, 2014, the entire contents of which are hereby incorporated by reference herein.

FIELD

The present disclosure relates to resistive memory cell precursors and methods of making the same. Devices including resistive memory cells manufactured from such precursors are also described.

BACKGROUND

Resistive memory, such as resistive random access memory (ReRAM or RRAM) generally includes a plurality of resistive memory cells. Such cells may be in the form of a two terminal device in which a comparatively insulating switching layer or medium is positioned between two conductive electrodes. In some instances, such devices include one transistor (1T) or one diode (1D) along with one resistor (1R), resulting in 1T1R or 1D1R configurations. The resistive memory cells of RRAM can change between two different states in response to a voltage, namely a high resistance state (HRS) which may be representative of an OFF or 0 state; and a low resistance state (LRS) which may be representative of an ON or a 1 state.

Some resistive memory devices operate based on the formation and breakage of filamentary channels (hereinafter, filaments) within the switching layer of individual resistive memory cells. Such devices, referred to herein as filamentary resistive memory, require the execution of an initial forming process, during which a relatively high voltage stress (known as a forming voltage) is applied to a memory cell precursor. During the application of the forming voltage, at least some vacancies within the switching layer redistribute to form one or more filaments that provide a low resistance pathway between the conductive electrodes of the cell. The resulting resistive memory cell may then be toggled between a high and low resistive state by the application of a reset and set voltage, respectively.

As may therefore be appreciated, some filamentary resistive memory cells are manufactured by applying a forming voltage to a switching layer precursor that includes oxygen vacancies that are distributed therein. Although such processes have shown promise, they generally rely on the use of cell precursors that offer limited control over the distribution of oxygen vacancies in the switching layer precursor. As a result, such processes also offer limited control over the geometry or other characteristics of the filament(s) formed by application of the forming and/or SET voltage. Moreover in some instances, such processes rely on precursors that include an oxygen exchange layer to react with oxygen in the switching layer precursor to produce oxygen vacancies, e.g., in an annealing process. Although effective to produce oxygen vacancies, in many instances some portion of the OEL may remain unreacted after the annealing process. When present the residual unreacted OEL may further react with oxygen in the switching layer produced by the forming process, potentially changing the performance characteristics of the resistive memory cell over time. This can be of particular concern in instances where the OEL is manufactured from the same material as an overlying electrode.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

Figure 1A:
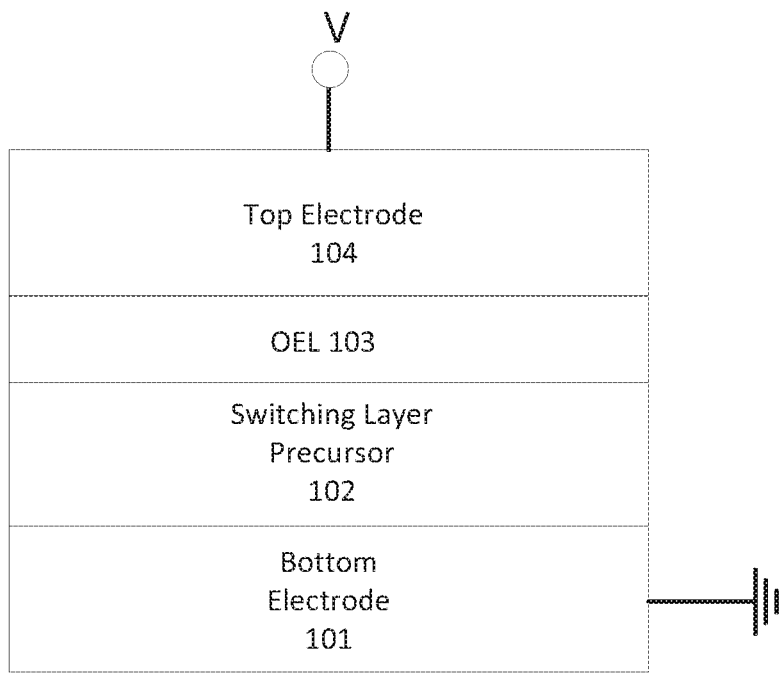
FIG. 1A is a block diagram of the structure of one example of a resistive memory cell precursor structure.

Although the following Detailed Description will proceed with reference being made to illustrative embodiments, many alternatives, modifications, and variations thereof will be apparent to those skilled in the art.

DETAILED DESCRIPTION

The terms "over," "under," between," and "on," are often used herein to refer to a relative position of one material layer or component with respect to other material layers or components. For example, one layer disposed on (e.g., over or above) or under (below) another layer may be directly in contact with the other layer, or may have one or more intervening layers. Moreover one layer disposed between two other layers may be directly in contact with the two other layers or may be separated by one or more of the other layers, e.g., by one or more intervening layers. Similarly unless expressly indicated to the contrary, one feature that is adjacent to another feature may be in direct contact with the adjacent feature, or may be separated from the adjacent feature by one or more intervening features. In contrast, the terms "directly on" or "directly below" are used to denote that one material layer is in direct contact with an upper surface or a lower surface, respectively, of another material layer. Likewise, the term "directly adjacent" means that two features are in direct contact with one another.

As briefly explained in the background, interest has grown in the use of resistive memory such as resistive random access memory (RRAM) for short or long term storage of information. In general, resistive memory includes a plurality of resistive memory cells that may transition between a high resistance state (HRS) or ON state and a low resistance state (LRS) or OFF state, e.g., in response to the application of a voltage (e.g., a set voltage or a reset voltage). Information may therefore be stored in such devices in the form of logical 1's and 0's, e.g., by appropriately controlling the state of the resistive memory cells in the device.

Some resistive memory cells include a bottom (first) electrode, a switching layer formed on the first electrode, and top (second) electrode formed on the switching layer. The first electrode may be connected to electrical ground, and the second electrode connected to a voltage source, V. The voltage source may be supplied, for example, by a transistor in a 1T1R or a diode in a 1D1R configuration. In general, the switching layer is formed of or includes a material that can be toggled between a high resistance and a low resistance state, e.g., in response to an applied voltage. For example, in instances where a resistive memory cell is a filamentary resistive memory cell, it may include a switching layer that is formed from an oxide that contains a plurality of oxide vacancies. In some embodiments and as will be described later, the switching layer may be fully or partially formed from a sub-stoichiometric oxide, which may be understood as an oxide that does not contain a stoichiometric amount of oxygen. In some embodiments, the term sub-stoichiometric oxide is used herein to refer to an oxide that contains more oxygen vacancies than a corresponding substantially or fully stoichiometric oxide, as generally described above.

With the foregoing in mind, some filamentary resistive memory cells are produced from a cell precursor that includes a switching layer precursor and an oxygen exchange layer (OEL). One example of such a precursor is depicted in FIG. 1A. As shown in, precursor 100 includes bottom (first) electrode 100, switching layer precursor 102, oxygen exchange layer (OEL) 103, and top (second) electrode 104. Switching layer 102 is formed on bottom electrode 102, and may be formed from or include any suitable switching layer material. For example and as will be described later, in some embodiments switching layer precursor 102 may be or include a substantially stoichiometric oxide, which may be understood as an oxide that contains at least 99% (or even at least 99.9%) of the fully stoichiometric amount of oxygen for the relevant oxide. Without limitation, in some embodiments switching layer precursor 102 is a fully stoichiometric oxide, which may be understood as an oxide that contains the fully stoichiometric amount of oxygen.

OEL 103 generally includes or is formed from a layer of oxygen reactive material. As used herein, the term "oxygen reactive material" refers to materials that can react with switching layer precursor 102 (or, more specifically, with oxygen contained therein), so as to convert at least a portion of switching layer precursor 102 to a sub-stoichiometric oxide. This reaction may be facilitated, for example, by processing the cell precursor, e.g., with the application of heat. In any case and as may be appreciated, reaction of the oxygen reactive material with oxygen in switching layer precursor 102 may convert the oxygen reactive material to one or more corresponding oxide(S), while at the same time converting at least a portion of switching layer 102 to a sub-stoichiometric oxide.

Figure 1B:
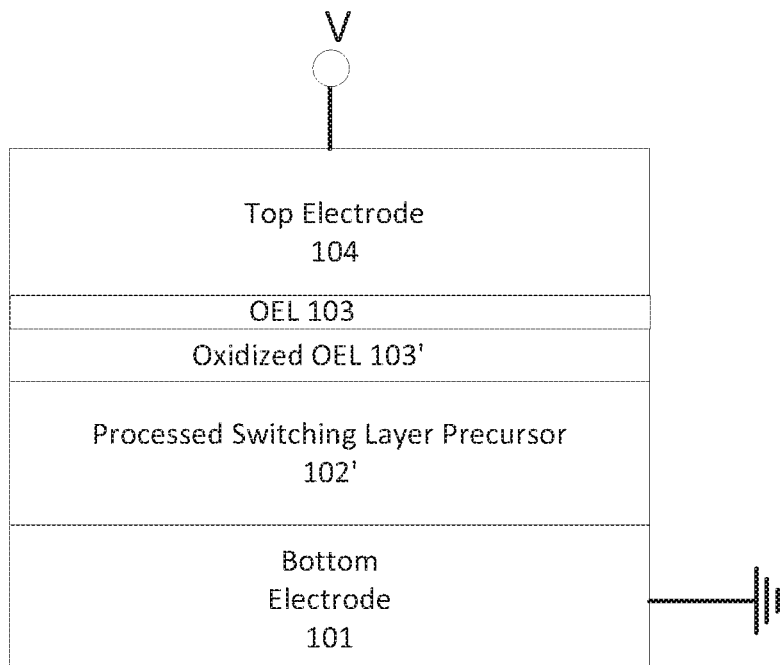
FIG. 1B is a block diagram of the precursor of FIG. 1A, after a heat treatment process.

The foregoing concept is illustrated in FIG. 1B, which illustrates the structure of cell precursor 100 after it has been processed (e.g., by an annealing process) to cause the reaction of oxygen reactive material in OEL 103 with oxygen in switching layer precursor 102. As shown, processed cell precursor 100' includes processed switching layer precursor 102', and a region of oxidized OEL 103'. In instances where the entirety of OEL 103 is not reacted, processed cell precursor 100' may also include a region of unreacted oxygen reactive material, shown in FIG. 1B as OEL 103. Consistent with the foregoing discussion all or a portion of processed switching layer 102' includes a plurality of vacancies (e.g., oxygen vacancies), and oxidized OEL 103' includes one or more oxides of the oxygen reactive material in OEL 103. As may be appreciated, OEL 103' is formed from or includes one or more oxides that do not form filaments when exposed to a forming voltage, or at least which does not form filaments in response to a forming voltage that will cause the formation of filaments in a switching layer.

It is noted that while oxidized OEL 103' is shown in FIG. 1B as a region that is distinct from OEL 103, such structure is not necessary. Indeed in some embodiments oxidized OEL 103' may be in the form of one or more oxides of the oxygen reactive material of OEL 103, wherein such oxides are distributed (e.g., randomly, homogenously, inhomogenously, etc.) within unreacted oxygen reactive material of OEL 103. Indeed, the present disclosure envisions embodiments wherein all or a portion of the sub-stoichiometric oxide formed by the reaction of the oxygen reactive material of OEL 103 and oxygen in switching layer 102 is/are confined to one or more predetermined portions of processed switching layer 102', such as an inner region thereof. It is also noted that all of switching layer precursor 102 need not be converted to a sub-stoichiometric oxide during the processing of cell precursor 100. This concept is illustrated in FIG. 2A, which illustrates processed switching layer precursor 102' as including base material 202, wherein base material 202 may in the form of an unreacted oxide of switching layer precursor 102.

It is also noted that while OEL 103 and top electrode 104 are shown as distinct regions of precursor 100, such a structure is not required. Indeed in some embodiments, top electrode and OEL 103 may be formed a single layer of a material that is both conductive and which is reactive with oxygen in switching layer precursor 102. One non-limiting example of such a material is titanium, though other materials may of course be used.

Figure 2A:
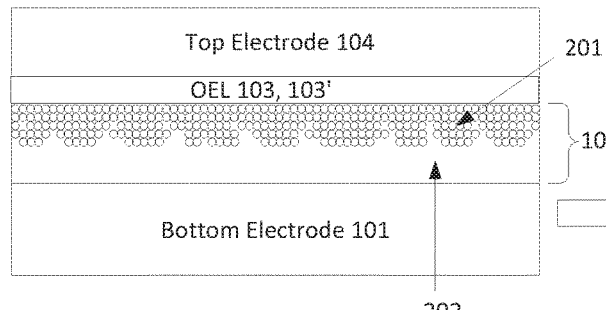
FIGS. 2A-2D stepwise illustrate one example process for forming a resistive memory cell.

As further shown in FIG. 2A and briefly described above, reaction of the oxygen reactive material of OEL 103 with oxygen in switching layer precursor 102 results in the production of processed cell switching layer precursor 102', which contains a plurality of vacancies 201. In this case because OEL 103 was disposed over the entire width of the upper surface of switching layer precursor 102 prior to processing (as shown in FIG. 1A), the reaction of the oxygen reactive material in OEL 103 with the oxygen in switching layer precursor 102 may be confined to the region proximate the upper surface of switching layer precursor 102. As a result, the concentration of vacancies 201 may be relatively high proximate the interface of processed switching layer precursor 102' and OEL 103 (or an oxide 103' thereof), but may decrease with increasing distance from such interface, i.e., within regions of processed switching layer precursor 102' that are increasingly proximate the interface of processed switching layer precursor 102' and bottom electrode 101. Put in other terms, vacancies 201 may be present in a gradient distribution within processed switching layer precursor 102', wherein the concentration of vacancies decreases with increasing distance from the interface of switching layer precursor 102' and OEL 103 (or an oxide 103' thereof).

Figure 3:
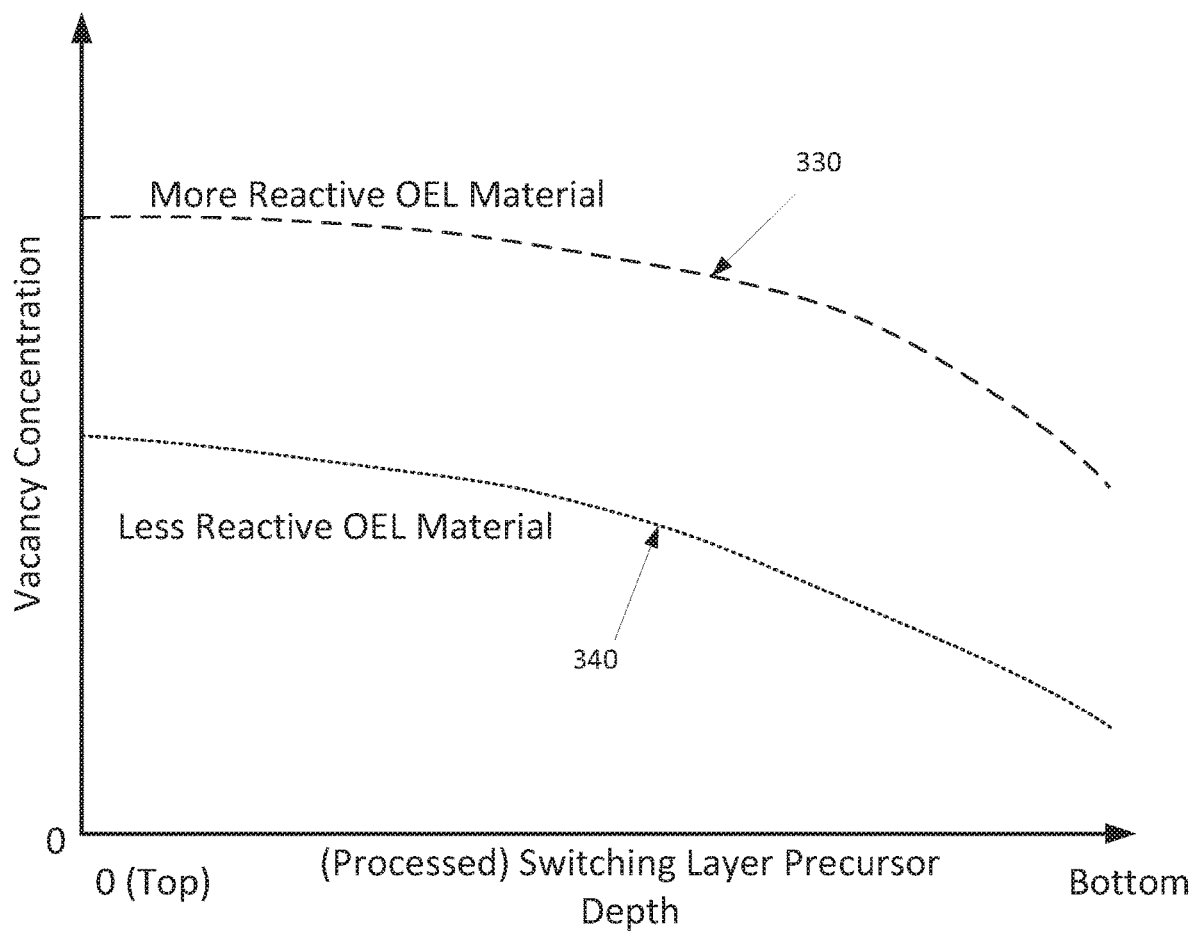
FIG. 3 is a plot of vacancy concentration versus switching layer precursor depth, for one example of a resistive memory cell precursor.

The foregoing concepts are illustrated in FIG. 3, which depicts an example plot of the concentration of vacancies versus (processed) switching layer precursor depth, assuming the OEL 103 is manufactured from either a highly oxygen reactive material, or a moderately oxygen reactive material. In this context, "(processed) switching layer depth" refers to the relative distance from the upper surface of a switching layer precursor (or a processed switching layer precursor), prior to application of a forming voltage. As may therefore be understood, (processed) switching layer depth may refer to a particular region or regions within the thickness of the switching layer precursors described herein. It is also noted that FIG. 3 depicts example distributions under the assumption that an OEL is formed over the entire upper surface of a switching layer precursor, e.g., as shown and described above with regard to FIGS. 1A, 1B, and 2A.

As shown in FIG. 3, when the OEL (e.g., OEL 103) is formed from material exhibiting relatively high oxygen reactivity and the resultant structure is processed (e.g., by annealing), the resulting processed cell precursor may include a processed switching layer precursor containing a plurality of vacancies, wherein the vacancies are present in a distribution 330 therein. In contrast when the OEL (103) is formed from material that exhibits relatively moderate reactivity with oxygen and is processed, the resulting processed cell precursor may include a plurality of vacancies that are present in a distribution 340 therein. While the number of vacancies may vary between distributions 330 and 340, the overall distribution of vacancies in such distributions is substantially similar. That is, both distributions 330, 340 indicate the presence of a gradient of vacancies within a processed switching layer precursor, wherein the concentration of such vacancies decreases with increasing (processed) switching layer depth.

Figure 2C:
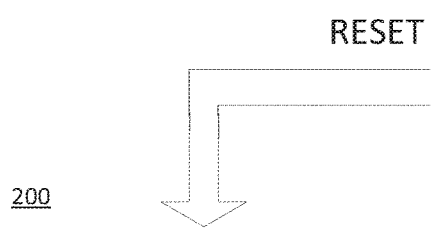
Figure 2B:
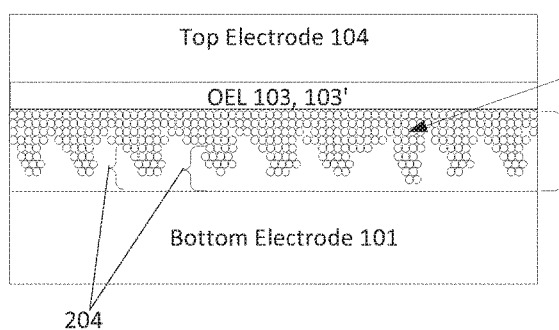

Once oxygen vacancies are present in a switching layer precursor (as in the case of processed switching layer precursor 102'), a forming process may be performed to cause at least a portion of the vacancies therein to reorganize into one or more filaments, resulting in the production of a switching layer. As used herein, the term "forming process" refers to a process during which a (relatively high) voltage is applied to a resistive cell precursor (or, more particularly, a switching layer precursor thereof), so as to cause vacancies within the switching layer precursor to form one or more filamentary channels. The parameters and manner of executing a forming process in the context of resistive memory is well understood in the art, and therefore is not discussed in detail herein. In any case, an outcome of a forming process may be understood to be the formation of a resistive memory cell that includes a switching layer containing one or more filaments. This concept is best illustrated in FIG. 2B, which illustrates the production of filaments 203 of vacancies 201 in switching layer 102" in response to the execution of a forming process on precursor 200. As may be understood, formation of such filaments may provide low electrical resistance pathways between a bottom and top electrode of a resistive memory cell, thus lowering the resistance of the cell and placing the cell in a low resistance (e.g., ON) state.

Figure 2D:
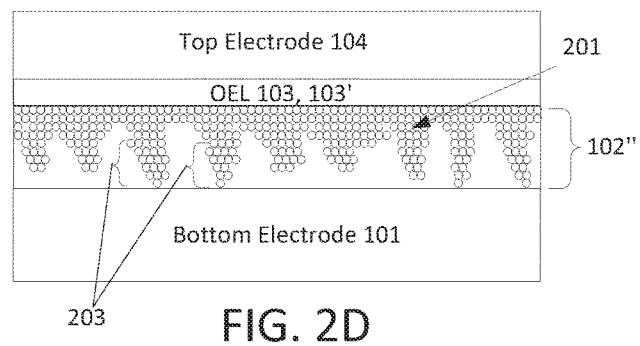

Subsequent to the execution of the forming process, the resistive memory cell may be toggled between an OFF state (HRS) and an ON state (LRS) by the application of reset and set voltages, respectively. As shown in FIG. 2C, application of a reset voltage to switching layer 102" may break filaments 203, thereby increasing the resistance of switching layer 102" and placing the resistive memory cell in an OFF (HRS) state. Subsequently and as shown in FIG. 2D, application of a set voltage to switching layer 102" may result in the reformation of filaments 203, thereby reducing the resistance of switching layer 102" and placing the resistive memory cell in an ON (LRS) state. The set voltage may be the same or different as the reset voltage, and may be the same or different polarity as the reset voltage, as understood in the art. In any case, the parameters and manner of applying a set or reset voltage in the context of resistive memory is well understood in the art, and therefore is not discussed in detail herein.

Moving on, the inventors have found that the distribution of vacancies within a switching layer precursor prior to the execution of a forming process can impact the physical and/or electrical characteristics of a resistive memory cell produced therefrom. For example, the inventors have found that the distribution of vacancies in a (processed) switching layer precursor can impact the number, profile, and/or dimensions of the filament(s) formed in a switching layer produced by the application of a forming voltage thereto. In this regard and as will be appreciated from the foregoing discussion, the inventors discovered that cell precursors of the structure of FIG. 1A offer relatively limited control over the distribution of vacancies therein, prior to the application of a forming voltage. As such, they also offer relatively limited control over the characteristics of the filament(s) that may be formed in response to the application of a forming voltage.

In addition the inventors have found that when a precursor of the structure of FIG. 1A is used, in many instances some portion of OEL 103 will remain unreacted after the precursor is subjected to a heat treating process (e.g., annealing), resulting in the structure of FIG. 1B. This is particularly true in instances where OEL 103 and top electrode 104 are formed from the same material. In any case, the presence of residual (unreacted) OEL 103 material may be undesirable, as it may later react with oxygen in switching layer of the resistive memory cell in which it is incorporated, thus potentially altering the electrical properties of the cell over time.

With the foregoing in mind, the present disclosure generally relates to resistive memory cells, devices, and methods of forming the same, wherein the distribution of vacancies within a switching layer precursor is controlled prior to the execution of a forming process. As will become apparent from the following discussion, controlling the distribution of vacancies in the switching layer precursor may enable a forming processes that favor the formation of a predictable number of filaments within a switching layer, and, in some cases, the formation of filaments having desired physical and/or electrical characteristics such as width, profile, set voltage, reset voltage, combinations thereof, and the like. As will be described in detail below, the methods described herein afford significant control over the distribution of oxide vacancies in a switching layer precursor, i.e., prior to the execution of a forming process, and therefore can open avenues to the production of switching layers including one or more filaments with desired physical or electrical characteristics. Moreover in some embodiments, the methods described herein enable the production of precursors in which the distribution of vacancies therein is preserved and/or locked in once the precursor is fabricated, limiting or even preventing short or long term modification of the physical and/or electrical properties of the switching layer.

Figure 4:
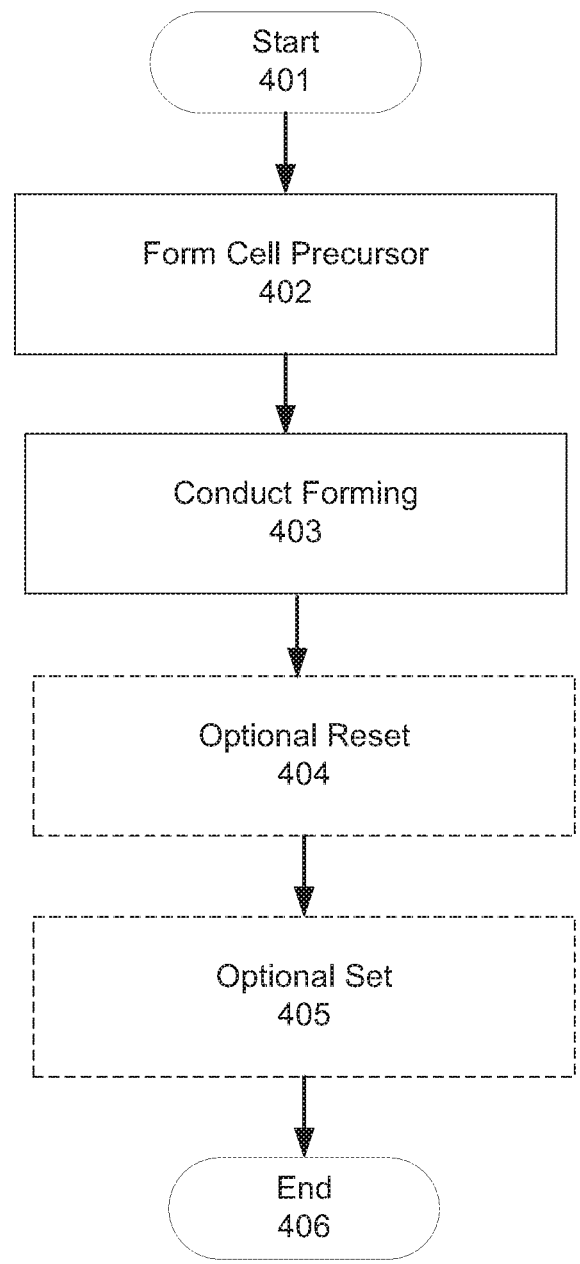
FIG. 4 is a flow diagram of example operations of one example method of making a resistive memory cell consistent with the present disclosure.

With the foregoing in mind, one aspect of the present disclosure relates to cell precursors and methods of forming resistive memory cells from such precursors. In this regard reference is made to FIG. 4, which is a flow chart of example operations of a generic method of making a resistive memory cell from a cell precursor consistent with the present disclosure. As shown, method 400 begins as block 401. The method may then proceed to block 402, wherein a cell precursor may be formed. As will be discussed, the structure of the cell precursors described herein and the methods that may be used to manufacture such precursors can vary considerably. For example, in some embodiments the precursor may be of the structure shown in FIG. 5A-5B, 7A-7B, or 9A-9B, each of which will be described in detail later.

Once a cell precursor is provided the method may proceed to block 403, wherein a forming process may be executed to convert a switching layer precursor in the cell precursor to a switching layer containing one or more filaments. As discussed briefly above, execution of the forming process generally involves applying a voltage (forming voltage) to the precursor (or a switching layer precursor thereof). The switching layer precursor may be configured such that, in response to application of the forming voltage, at least a portion of the vacancies contained therein form one or more filaments. After the forming process, the method may end, or optional reset and/or set processes may be performed pursuant to optional blocks 404 and 405, respectively, to break and reform filaments generated by the execution of the forming process. In any case, the method may end pursuant to block 406.

Figure 5A:
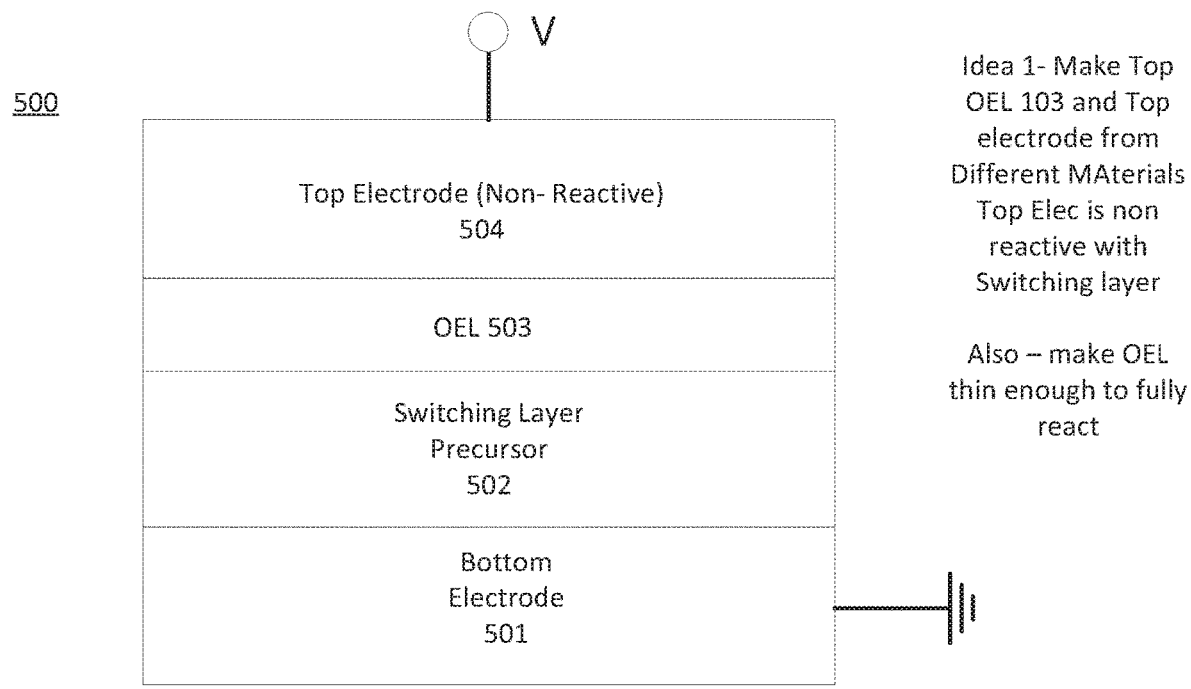
FIG. 5A is a block diagram of the structure of one example of a resistive memory cell precursor consistent with the present disclosure.

With the foregoing in mind attention is drawn to FIG. 5A, which depicts one example of a cell precursor consistent with the present disclosure. As shown, cell precursor 500 includes a first (bottom) electrode 501, a switching layer precursor 502 formed on bottom electrode 501, an oxygen exchange layer (OEL) 503 on switching layer precursor 502, and a top-electrode 504. In this example, bottom electrode 501 is shown as connected to electrical ground, and top electrode 504 is shown as being connected to a voltage source, V. It should be understood that this illustration is for the sake of example only, and that electrical connections to cell precursor 500 may be made in any suitable manner. Furthermore while FIGS. 5A and B depict embodiments of cell precursors in which OEL 503 is formed on an upper surface of switching layer precursor 502, it should be understood such structure is not required and that OEL 503 may be formed at any suitable location. Indeed, the present disclosure envisions embodiments in which OEL 503 is formed below switching layer precursor 502.

This thickness of bottom electrode 501 and top electrode 504 may be the same or different, and electrodes of any suitable thickness may be used. In some embodiments, the thickness of bottom electrode and top electrode each range from about 5 to about 100 nm, such as from about 50 to about 50 nm. Likewise OEL 503 may have any suitable thickness, and in some embodiments has a thickness ranging from about greater than 0 to about 30 nm, such as about 2 to about 10 nm. Finally, switching layer precursor 502 may have any suitable thickness, and in some embodiments has a thickness ranging from about 2 to about 20 nm, such as about 2 to about 10 nm.

Bottom electrode 501 may be formed from a first electrode material, which may be any suitable electrode material. As non-limiting examples of suitable first electrode materials that may be used, mention is made of metals such as aluminum, copper, titanium, tungsten, ruthenium, rhodium, palladium, silver, osmium, iridium, platinum, and gold, metal nitrides such as titanium nitride, tantalum nitride, combinations thereof, and the like. Without limitation, bottom electrode 502 in some embodiments is formed from a conductive material that does not react (or does not substantially react) with switching layer precursor 502 (or, more particularly, with the oxygen contained therein). Non-limiting examples of such materials include metallic nitrides, carbides, and less reactive/noble metals such as platinum, gold, palladium, nickel, tungsten, iridium, rhodium, rhenium, combinations thereof, and the like.

In the embodiment of FIG. 5A, switching layer precursor 502 may be formed from or include a substantially stoichiometric oxide. As used herein, the term "substantially stoichiometric oxide" refers to an oxide that contains a fully stoichiometric amount of oxygen, or in which the mole fraction of oxygen in the oxide differs from the stoichiometric amount by less than about 0.5%, such as less than about 0.15, or even less than about 0.01%. In instances where an oxide contains 100% of the stoichiometric amount of oxygen, such oxide may be referred to herein as a "fully" stoichiometric oxide, though it should be understood that fully stoichiometric oxides are encompassed by the term, "substantially stoichiometric oxide." Without limitation, switching layer precursor 502 preferably is formed from a fully stoichiometric oxide.

Non-limiting examples of suitable substantially stoichiometric oxides that may be used to form switching layer precursor include substantially stoichiometric: hafnium oxide ($HfO_{2-x}$), tantalum oxide ($Ta_2O_{5-x}$), nickel oxide ($NiO_{2-x}$), tungsten (III) oxide ($W_2O_{3-x}$), tungsten (IV) oxide ($WO_{2-x}$), tungsten (VI) oxide ($WO_3$-x), tungsten pentoxide ($W_2O_{5-x}$), titanium oxide ($TiO_{2-x}$), zirconium oxide ($ZrO_{2-x}$), vanadium oxide ($VO_{2-x}$), copper (II) oxide ($CuO_{1-x}$), aluminum oxide ($Al_2O_{3-x}$), combinations thereof, and the like. In some embodiments, x is less than about 0.5%, less than about 0.1%, or even less than about 0.01% of the fully stoichiometric oxygen content of the corresponding stoichiometric oxide. Without limitation, in some embodiments switching layer precursor 502 is one or more layers of fully stoichiometric oxide, i.e., one or more of the above noted oxides, wherein x is 0. In specific non-limiting embodiments, switching layer precursor 502 is one or more layers of substantially and/or fully stoichiometric hafnium oxide ($HfO_{2-x}$), tantalum oxide ($Ta_2O_5$-x), or a combination thereof.

OEL 503 is generally formed from one or more oxygen reactive materials, i.e., materials which may react with switching layer precursor 502 (or, more particularly, oxygen therein) to form one or more oxides. Non-limiting examples of suitable oxygen reactive materials that may be used to form OEL 503 include metals such as hafnium, titanium, tantalum, and combinations thereof. Of course such materials are identified for the sake of example only, and other suitable materials may be used. In any case, it may be appreciated that when the oxygen reactive materials of OEL 503 react with switching layer precursor 502 they may form one or more of their corresponding oxides (e.g., hafnium oxide, titanium oxide, tantalum oxide, combinations thereof, and the like).

The thickness of OEL 503 may vary considerably, and an OEL of any suitable thickness may be used. In some embodiments, the thickness of OEL 503 ranges from greater than 0 to about 20 nm, such as greater than 0 to about 15 nm, or even greater than 0 to about 10 nm. Without limitation, in some embodiments the thickness of OEL 503 is set such that when cell precursor 500 is subject to a heat treatment process, all of the oxygen reactive material in OEL 503 is converted to reacted oxygen reactive material, in this case one or more oxides of the oxygen reactive material(s) forming OEL 503.

Top (second) electrode 504 may be formed from any suitable conductive material. Without limitation, in some embodiments top electrode is formed from a second electrode material, wherein the second electrode material is a conductive material that does not or does not substantially react with oxygen. As used herein the term "does not substantially react with oxygen" when used in connection with an electrode refers to a conductive material that does not react/substantially react with oxygen in a switching layer or precursor therefore under the conditions that may be applied to react oxygen reactive material of an oxygen exchange layer with oxygen in a switching layer precursor, under the normal operating parameters of a resistive memory cell, or a combination thereof. Accordingly top electrode 504 may be configured such that it does not reach with oxygen under the conditions applied when a heat treatment process is applied to react the oxygen reactive material of OEL 503 with oxygen in switching layer precursor 502 (as described below).

Non-limiting examples of suitable second electrode materials that may be used as top electrode 504 include conductive metal nitrides (e.g., titanium nitride), conductive metal carbides (e.g., titanium carbide), and less reactive metals such as platinum, gold, palladium, nickel, tungsten, iridium, rhodium, rhenium, combinations thereof, and the like. Without limitation, in some embodiments top electrode 504 is formed from titanium, and OEL 503 is formed from hafnium oxide, tantalum oxide, titanium oxide, or combinations thereof.

In some embodiments in addition to being substantially non-reactive with oxygen, the materials used to form top electrode 504 and/or bottom electrode 501 may be fully or substantially oxygen impermeable. That is, in some embodiments top electrode 504 and/or bottom electrode 501 may be formed from materials that substantially limit or even prevent the passage of oxygen there through. In such instances it may be appreciated the top electrode 504 and/or bottom electrode 501 may insulate the other layers (and in particular switching layer precursor 502 or a switching layer formed therefrom) from exposure to oxygen, thereby locking in and/or preserving the amount and distribution of vacancies that may be formed in a switching layer or a precursor thereof, e.g., in response to the reaction of oxygen in switching layer precursor 502 and oxygen reactive material in OEL 503.

In any case, it may be understood that in some embodiments, top electrode 504 and OEL 503 may be formed from different materials, wherein OEL 503 is formed from one or more materials that is/are more reactive with oxygen than the material(s) forming top electrode 504. Because top electrode 504 does not or does not substantially react with oxygen, reactions between it and oxygen in switching layer precursor 502 (or a switching layer formed therefrom) may be limited or even prevented.

Figure 6:
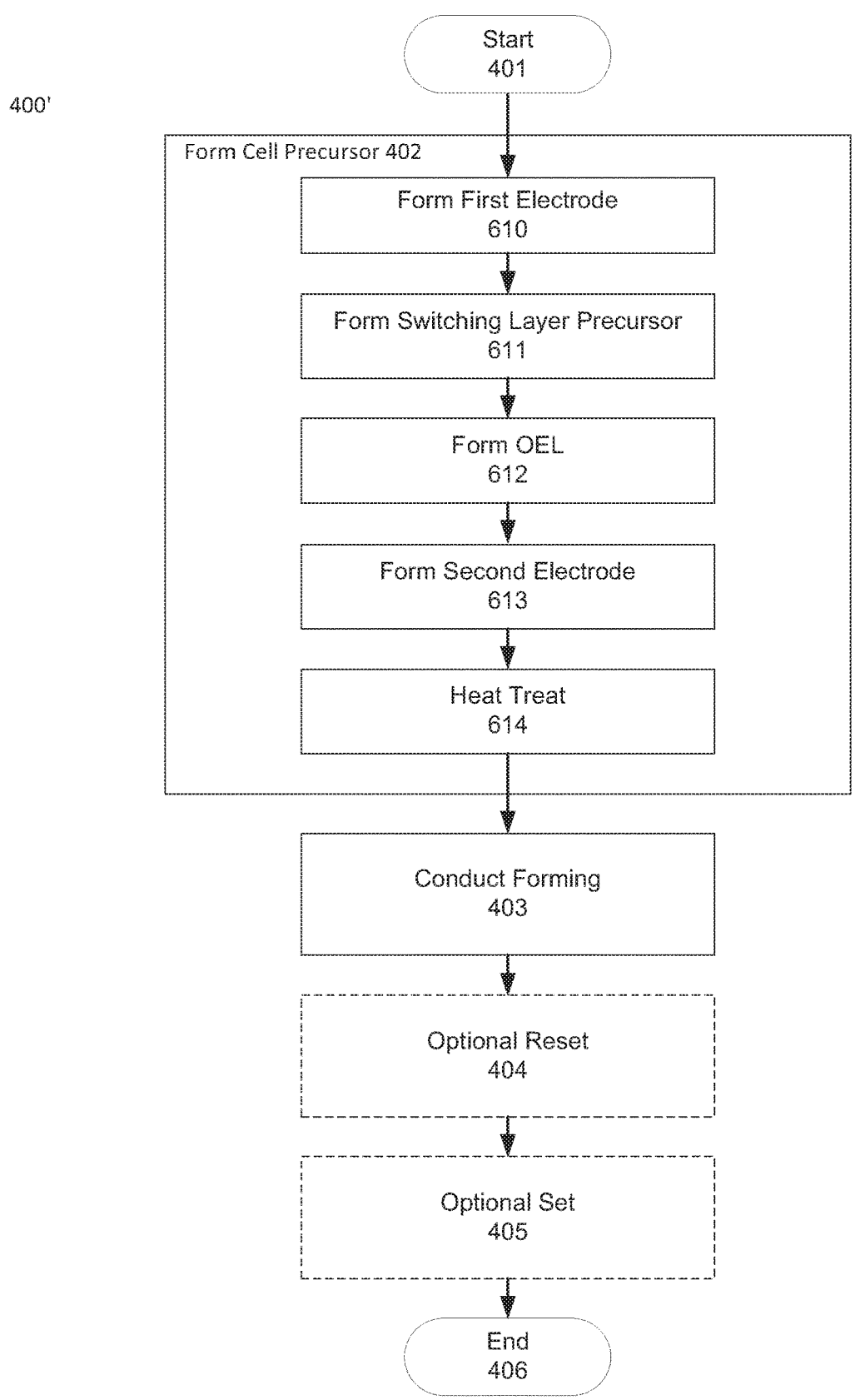
FIG. 6 is a flow chart of example operations of one example method of making a resistive memory cell precursor consistent with the structure of FIGS. 5A and 5B.

Attention is now drawn to FIG. 6, which is a flow diagram of a method of forming a resistive memory cell from a cell precursor consistent with the structure of FIGS. 5A and B. As shown, method 400' begins at block 401. The method may then proceed to block 402', wherein a cell precursor consistent with FIGS. 4A and 4B may be formed. Formation of the cell precursor may begin at block 610, wherein a first (bottom) electrode (i.e., bottom electrode 501 of FIG. 5A) may be formed. In this regard, the first electrode may be formed by depositing or otherwise forming a layer of a first electrode material, wherein the first electrode material is a conductive material (such as those noted above) via any suitable electrode forming process, such as via a metallization, chemical vapor deposition, or other suitable process. In some embodiments, the first electrode may be formed by metallizing or otherwise depositing a conductive material on a substrate.

The method may then advance to block 611, wherein a switching layer precursor may be formed on the first (bottom) electrode. More specifically, the method may proceed by depositing or otherwise forming switching layer precursor 502 on an upper surface of bottom electrode 501. In this regard, switching layer precursor may be formed in any suitable manner. For example, switching layer precursor may be formed by depositing one or more layer(s) of a substantially stoichiometric oxide on the first (bottom) electrode, e.g., via chemical vapor deposition (CVD), metal organic CVD, reactive CVD, atomic layer deposition (ALD), reactive sputtering, combinations thereof, and the like. Without limitation, switching layer precursor in some embodiments is formed by CVD, ALD, reactive sputtering, or a combination thereof.

Once the switching layer precursor has been formed, the method may proceed to block 612, pursuant to which an oxygen exchange layer (OEL) may be formed, e.g., on an upper surface of the switching layer precursor as shown in FIG. 5A. Consistent with the foregoing discussion, the OEL may be formed by depositing one or more layers of oxygen reactive material (e.g., titanium, hafnium, tantalum, combination thereof, and the like) via any suitable deposition process. For example, the oxygen reactive material(s) of the OEL may be deposited by chemical CVD, PCD, ALD, MBE, sputtering, combinations thereof, and the like. Without limitation, in some embodiments the OEL is formed by sputter depositing an oxygen reactive material on an upper surface of switching layer precursor 502. Alternatively, in other non-limiting embodiments the OEL is formed by depositing oxygen reactive material via CVD on the upper surface of switching layer precursor 502.

Following the formation of the OEL, the method may advance to block 613, wherein a second (top) electrode may be formed. As shown in FIG. 5A and discussed above, in some embodiments the second electrode is formed on an upper surface of the oxygen exchange layer that was formed pursuant to block 612. In this regard, the second (top) electrode may be formed by depositing or otherwise forming a layer of conductive material that is does not or does not substantially react with oxygen on the OEL. Regardless of its nature, the second electrode may be deposited or otherwise formed by any suitable electrode forming process, such as via a metallization, chemical vapor deposition, or other suitable process. In some embodiments, the second electrode may be formed by metallizing or otherwise depositing a conductive material on the OEL. As may be appreciated, following the formation of the second electrode, a cell precursor of the structure shown in FIG. 5A may be attained.

Figure 5B:
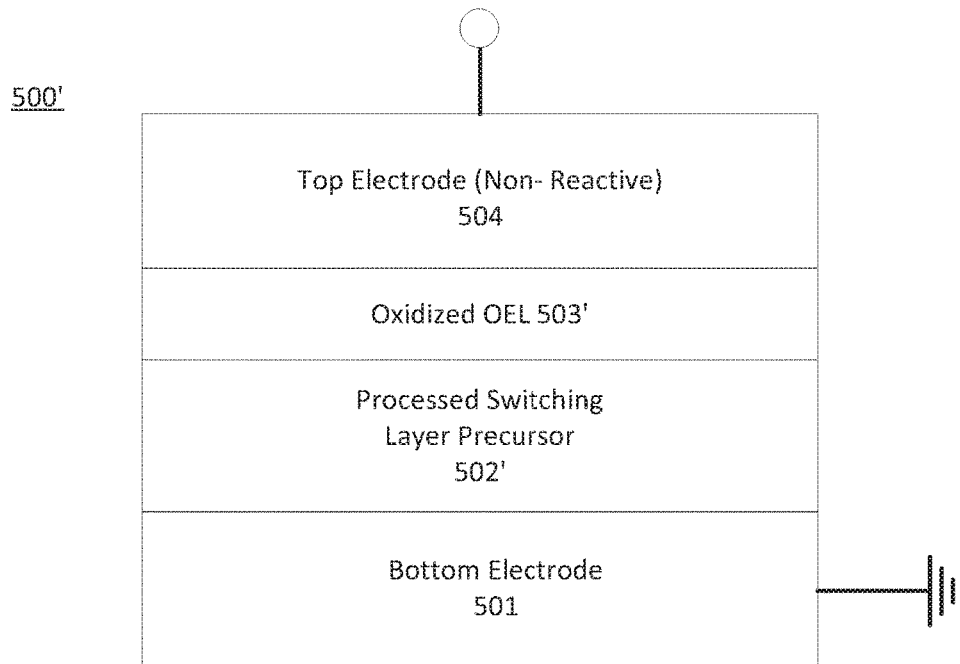
FIG. 5B is a block diagram of the structure of the precursor of FIG. 5A, after the performance of a heat treatment process.

Once the second electrode is formed pursuant to block 613 the method may advance to block 614, wherein the resulting structure (i.e., as shown in FIG. 5A) may be processed to react oxygen reactive material in OEL 503 with oxygen in the switching layer precursor 502. Consistent with the foregoing discussion and as shown in FIG. 6, such processing may be performed by heat treating cell precursor 500 at a temperature and for a time that is sufficient to cause the oxygen reactive material to react with oxygen in switching layer precursor 502, resulting in the production of a processed cell precursor 502' including oxidized OEL 503' and processed switching layer precursor 502', as generally shown in FIG. 5B. In some embodiments, pursuant to block 614 precursor 500 may be processed by annealing in an inert or slightly reducing atmosphere, and at a temperature ranging from about 300 to about 600° C. Without limitation, in some embodiments the atmosphere is an inert atmosphere that includes one or more inert gases, i.e., helium, neon, argon, krypton, xenon, radon, combinations thereof, and the like. Alternatively, in some embodiments the atmosphere includes one or a combination of the foregoing inert gases, as well as from greater than 0 to about 10% (e.g., about 5%) of hydrogen and/or other forming gases that may produce a slightly reducing atmosphere.

In general, oxidized OEL 503' includes one or more oxides of the oxygen reactive material forming OEL 503, and processed switching layer 502' includes a sub-stoichiometric oxide of the substantially stoichiometric oxide of switching layer precursor 502. Thus, for example, processed switching layer 502' may include one or more sub-stoichiometric metal oxides selected from sub-stoichiometric: hafnium oxide, tantalum oxide, nickel oxide, tungsten (III) oxide, tungsten (IV) oxide, tungsten (VI) oxide, tungsten pentoxide, titanium oxide, zirconium oxide, vanadium oxide, copper (II) oxide, aluminum oxide, or a combination thereof. As such, processed switching layer 502' may include a plurality of oxygen vacancies therein, as previously described.

Notably, because the second (top) electrode (504) and/or first (bottom) electrode 501 is/are is formed from a conductive material that does not or does not substantially react with oxygen, processing the precursor of FIG. 5A pursuant to block 614 may not result in the reaction of the material(s) of the first/second electrode with oxygen in the switching layer precursor. Moreover, in instances where top electrode 504 and/or bottom electrode 501 is oxygen impermeable (e.g., in the case of metal nitrides/carbides such as TiN or TiC), it/they may limit or prevent the exposure of processed switching layer precursor 502' to oxygen in the atmosphere. This in turn can limit or even prevent the occupation of the oxygen vacancies by oxygen in the surrounding environment.

It is noted that FIG. 5B illustrates an embodiment in which during or in response to processing/heat treatment, all of OEL 503 is converted to oxidized OEL 503', and all of switching layer precursor 502 is converted to processed switching layer precursor 502'. It should be understood that this illustration is for the sake of example, and that the present disclosure envisions embodiments in which some portion of OEL 503 and/or switching layer 502 remain unreacted after processing/heat treatment. Indeed in some embodiments, processing of cell precursor 500 may result in a processed cell precursor in which oxidized OEL 503' (e.g., an oxide of the material(s) of OEL 503) and processed switching layer precursor 502' (e.g., a sub-stoichiometric oxide of the material(s) of switching layer 502) are localized to an region proximate the interface of OEL 503 and switching layer precursor 502. In such instances, a region of (unreacted) OEL 503 may exist above the region of oxidized OEL 503'. Alternatively or additionally, a region of (unreacted) switching layer precursor 502 (i.e., substantially stoichiometric oxide) may exist below the region of processed switching layer precursor 502'.

Returning to FIG. 6, once cell precursor 500 has been processed pursuant to block 614, the method may proceed to block 403, wherein a forming process may be executed on the resulting structure. More specifically, a forming voltage may be applied to the resulting structure (e.g., FIG. 5B), e.g., via a voltage source, V, which may be connected to top electrode 504. In such embodiments and as previously described, bottom electrode 501 may be connected to ground. In response to the application of the forming voltage, vacancies within processed switching layer precursor 502' may form one or more filaments, resulting in the production of a resistive memory cell including a switching layer with one or more filaments formed therein, resulting in the production of a resistive memory cell.

At this point the method 400' may end, or the resistive memory cell may be toggled between a low resistance (ON) and a high resistance (OFF) state by the application of a voltage, such as a reset and set voltage. In this regard, method 400' may proceed to optional block 404, pursuant to which an optional reset voltage may be applied to the resistive memory cell. In general, the reset voltage may be any suitable voltage that is sufficient to break the filament(s) within the switching layer of the cell, so as to place the cell in a high resistance (e.g., OFF) state. Without limitation, in some embodiments the applied reset voltage may range from less than 0 to about −12V, such as from less than 0 to about −6V, from less than 0 to about −3V, or even from less than 0 to about −1.5V. In some embodiments, a reset voltage ranging from 0 to about −1.5V may be used to break filament(s) in the cell.

After the application of a reset voltage, method 400' may proceed from optional block 404 to optional block 405, wherein a set voltage may be applied. As discussed above, a set voltage may be any voltage that is sufficient to cause the reformation of one or more filaments within the switching layer of a resistive memory cell. Without limitation, in some embodiments the applied set voltage may be the same or different from the applied reset voltage, in either or both polarity and intensity. In some embodiments for example, the applied set voltage may range from greater than 0 to about 12V, such as from greater than 0 to about 6V, from greater than 0 to about 3V, or even from greater than 0 to about 1.5V. Without limitation, in some embodiments a set voltage ranging from 0 to about 1.5V may be used to reform the filament(s) within switching layers consistent with the present disclosure. Subsequent the application of a reset and/or set voltage (or if such application is not required), method 400' may proceed to block 406 and end.

Figure 7A:
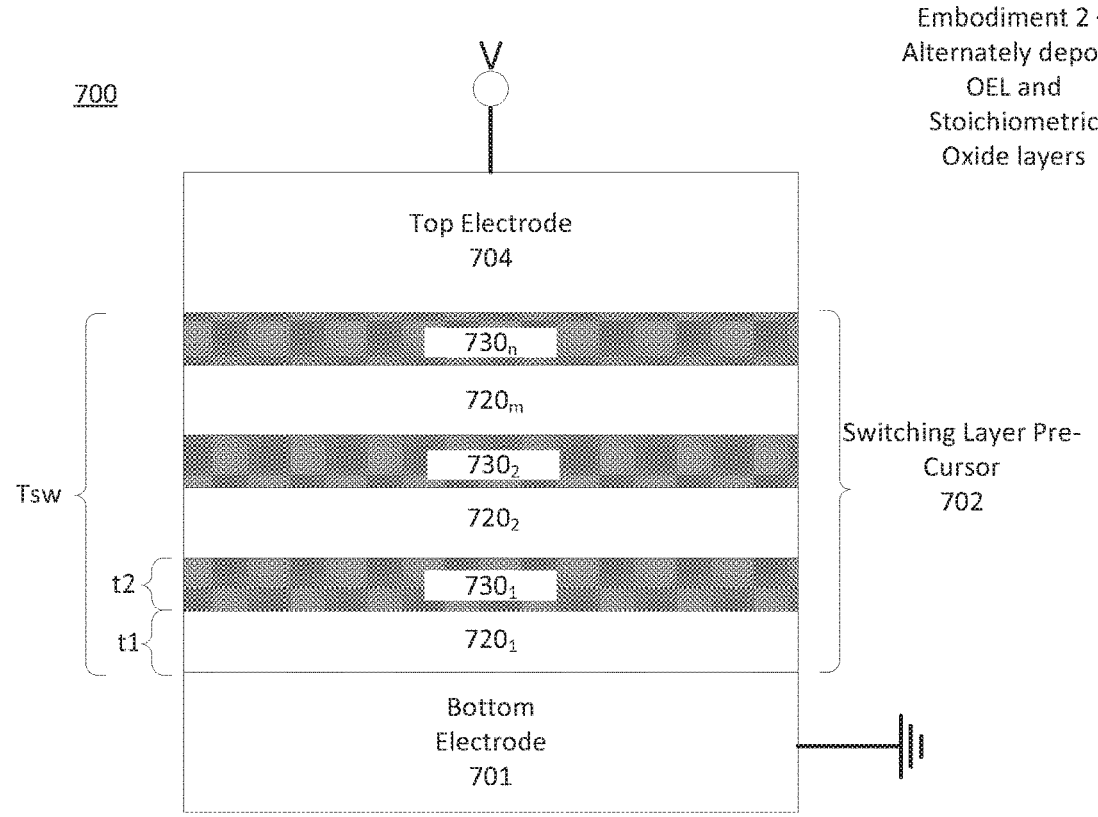
FIG. 7A is a block diagram of the structure of another example of a resistive memory cell precursor consistent with the present disclosure.

Attention is now drawn to FIG. 7A, which depicts another example of a cell precursor consistent with the present disclosure. As shown, cell precursor 700 includes a first (bottom) electrode 701, a switching layer precursor 702 formed on bottom electrode 701, and a top-electrode 704 formed on an upper surface switching layer precursor 702. The nature and characteristics of bottom electrode 701 and top electrode 704 are generally the same as those described above in connection with bottom and top electrodes 501 and 504, respectively. A detailed description of bottom and top electrode 704 is therefore not provided. It is noted, however, that in the embodiment of FIG. 7A, top electrode 704 may be formed from any suitable electrode material, and is not limited to second electrode materials that are conductive and which do not substantially react with oxygen.

As further shown in FIG. 7A, switching layer precursor 702 is in the form of a multilayer structure that includes a plurality of alternating layers. Specifically, switching layer precursor includes a plurality of oxide layers $720_1$, $720_2$, $720_m$, and a plurality of oxygen exchange (OEL) layers $730_1$, $730_n$, where n and m are 0 or greater than or equal to 2. In instances where n and/or m are 0, it should be understood that such layers are not present in the multilayer structure of switching layer precursor 702. Thus in the embodiment of FIG. 7A, switching layer precursor contains at least two oxide layers $720_1$, $720_2$, which are below and above, respectively, a single OEL layer $720_1$. However as indicated in the figure, additional oxide and OEL layers may be present.

In instances where n or m are non-zero, it should be understood that they may indicate the respective number of their corresponding oxide or OEL layer, and that they may range from greater than or equal 2, such as from 2 to about 5, 2 to about 10, 2 to about 15, 2 to about 20, etc. It should be furthermore understood that any suitable number of oxide and OEL layers may be used, and that the present disclosure envisions embodiment in which many tens, hundreds, or even thousands of oxide and/or OEL layers are used.

It is also noted that for the sake of example, FIG. 7A illustrates an embodiment in which switching layer precursor includes, at a minimum, a single OEL layer ($730_1$) that is formed between two oxide layers ($720_1$, $720_2$), with the first oxide layer ($720_1$) being formed on bottom electrode 701. It should be understood that this illustration is but one example configuration and that other configurations are possible and envisioned by the present disclosure. Indeed, the present disclosure envisions embodiments in which the order of the oxide layers and switching layers is reversed, e.g., such that at a minimum, the structure includes a single oxide layer that is between two OEL layers, with the first OEL layer being formed on bottom electrode 701.

In any case, the oxide layers $720_1$, $720_2$, $720_m$ in switching layer precursor 702 may include or be formed from one or more substantially stoichiometric oxides, such as those noted and described previously. Without limitation, in some embodiments oxide layers $720_1$, $720_2$, $720_m$ are each formed from substantially stoichiometric hafnium oxide, tantalum oxide, tungsten oxide, or a combination thereof.

OEL layers $730_1$, $730_n$, in switching layer precursor 702 may be formed from or include oxygen reactive material, such as the oxygen reactive materials noted and described previously. Without limitation, in some embodiments OEL layers $730_1$, $730_n$ are each include or are formed from the same oxygen reactive material, such as but not limited to titanium, hafnium, tantalum, combinations thereof, and the like. In other non-limiting embodiments, at least first and second OEL layers are used in the switching layer precursor 702, wherein the first OEL layer is formed from first oxygen reactive material, the second OEL layer is formed from a second oxygen reactive material, the first and second oxygen reactive materials exhibit first and second oxygen reactivities, respectively, and the first and second oxygen reactivities differ from one another. Thus, for example, thermodynamics may favor the reaction oxygen with the first oxygen reactive material more strongly than the reaction of oxygen with the second oxygen reactive material, or vice versa. As will become apparent from the following discussion, use of different oxygen reactive materials in such instance may provide some ability to control the distribution of oxygen vacancies formed by reacting the materials of the OEL layers with oxygen in an adjacent oxide layer.

As further shown in FIG. 7A, switching layer precursor may have a total thickness Tsw, which may be any suitable thickness. Without limitation, Tsw in some embodiments may range from greater than 0 to about 50 nm, such as about 5 to about 25 nm, or even about 5 to about 15 nm.

As also shown in FIG. 7A, oxide layers $720_1$, $720_2$, $720_m$ have a thickness t1 and OEL layers $730_1$, $730_n$ have a thickness t2. In general, t1 and t2 may range from greater than 0 to about 30 nm, such as about 2 to about 20 nm, or even about 2 to about 10 nm, though it should be understood that the oxide and OEL layers of switching layer precursor 702 may have any suitable thickness.

It is noted that FIG. 7A depicts an embodiment in which each oxide layer ($720_1$, $720_2$, $720_m$) has the same thickness (i.e., where t1 for each oxide layer is the same), and in which each OEL layer ($730_1$, $730_n$) has the same thickness (i.e., where t2 for each OEL layer is the same). It should be understood that this illustration is for the sake of example only, and the thickness of the oxide and OEL layers may vary from one another. For example in some embodiments a first and second oxide layer is included in switching layer precursor 702, wherein the first oxide layer has a thickness $t1_1$, the second oxide layer has a thickness $t1_2$, and $t1_1$ and $t1_2$ are the same or different. Likewise in some embodiments first and second OEL layers are included in switching layer precursor 702, wherein the first OEL layer has a thickness $T2_1$ and the second OEL layer has a thickness $T2_2$, wherein $T2_1$ and $T2_2$ are the same or different. In still further embodiments, the oxide and OEL layers in switching layer precursor 702 may have a thickness t1 and t2, respectively, wherein t1 and t2 are the same or differ from one another.

Figure 7B:
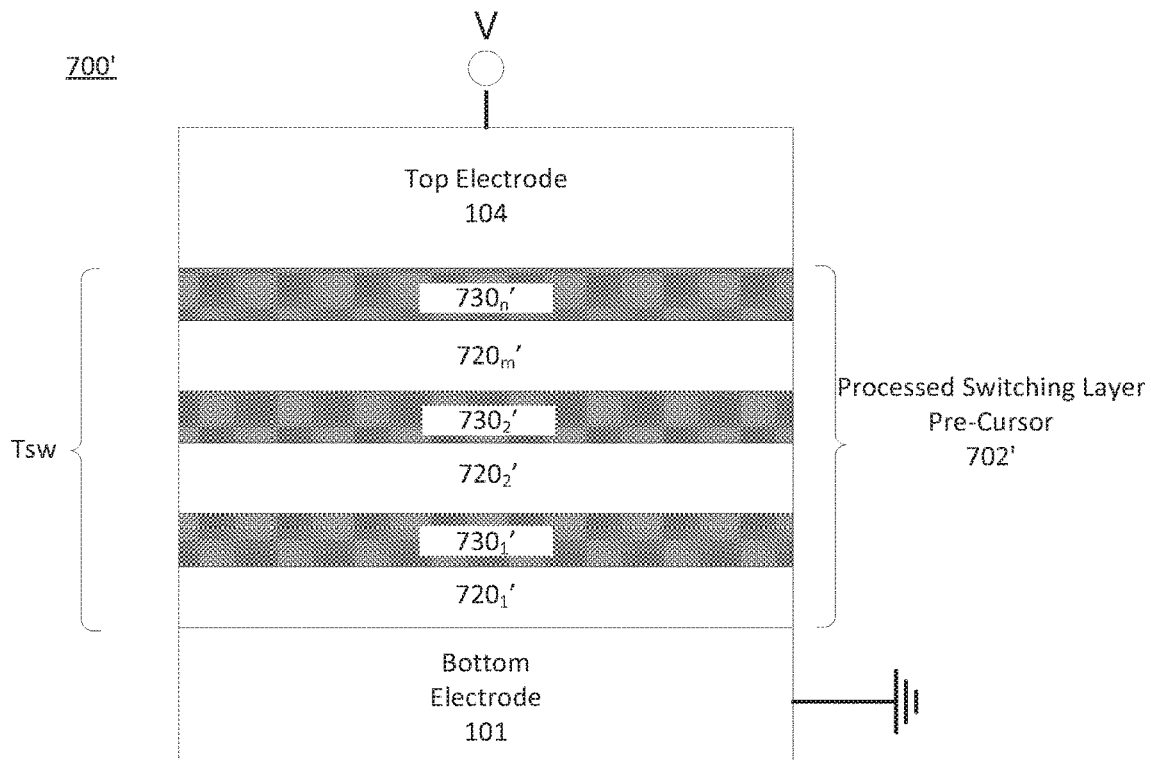
FIG. 7B is a block diagram of the structure of the precursor of FIG. 7A, after the performance of a heat treatment process.

As will be described in detail later, precursor 700 may be processed, e.g., by annealing or another heat treatment process to react the oxygen reactive material in OEL layers 730, $730_m$ with oxygen in adjacent oxide layers $720_1$, $720_g$. During such reaction, at least a portion of the oxygen reactive material in OEL layers 730, $730_m$ is converted to reacted oxygen reactive material, namely one or more oxides of the oxygen reactive material. Likewise, at least a portion of the substantially stoichiometric oxide of oxide layers $720_1$, $720_n$ is converted to a corresponding sub-stoichiometric oxide. This concept is illustrated in FIG. 7B, which depicts processed precursor 700' as including processed switching layer precursor 702', which in turn includes alternating processed oxide ($720_1$', $720_n$') and processed OEL ($730_1$', $730_n$') layers. Processed oxide layers $720_1$', $720_n$' include a sub-stoichiometric oxide (e.g., those noted above, e.g., for element 502') and a plurality of oxygen vacancies, whereas processed OEL layers $730_1$', $730_n$' contain a corresponding oxide of OEL layers $730_1$, $730_n$.

As may be appreciated, the distribution of vacancies within processed switching layer precursors may be controlled by the appropriate selection of materials for the oxide and OEL layers, by controlling the thickness of the oxide and OEL layers, or a combination thereof. For example, by controlling such parameters a wide variety of vacancy distributions may be obtained. In some embodiments, the oxide and switching layers of switching layer precursor 702 may be configured such that in response to processing (e.g., annealing or another heat treatment process), the resulting processed switching layer includes controlled distribution of oxygen vacancies. In some instances the controlled distribution may be a linear distribution, a parabolic distribution, a logarithmic distribution, an exponential distribution, a stepped distribution, a polynomial distribution, an asymptotic distribution, or the like.

Figure 11A:
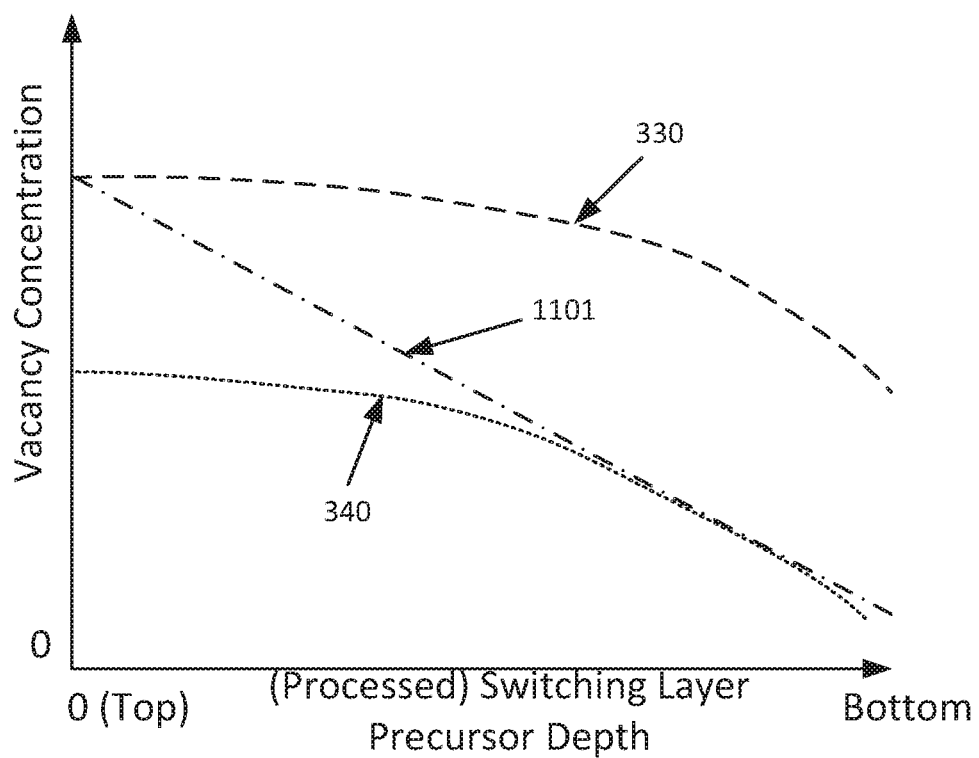
FIGS. 11A-11E are plots of example vacancy concentration versus switching layer precursor depth consistent with various embodiments of the present disclosure.

As one example of a linear distribution of oxygen vacancies reference is made to FIG. 11A, which is a plot of vacancy concentration versus (processed) switching layer precursor depth consistent with one example embodiment. It should be understood that switching layer precursor depth refers to the distance from an upper surface of a switching layer precursor, such as processed switching layer 702'. In the embodiment of FIG. 11A, curve 1101 represents a linear distribution of oxygen vacancies, in which the concentration of oxygen vacancies in the switching layer precursor decreases linearly as switching layer precursor depth increases. For the sake of comparison, curves 330 and 340 (as described above in connection with FIG. 3) are also shown in FIG. 11A. Of course, other linear distributions are possible, such as a linear distribution in which the concentration of oxygen vacancies in the switching layer precursor increases with increasing switching layer precursor depth.

Figure 11B:
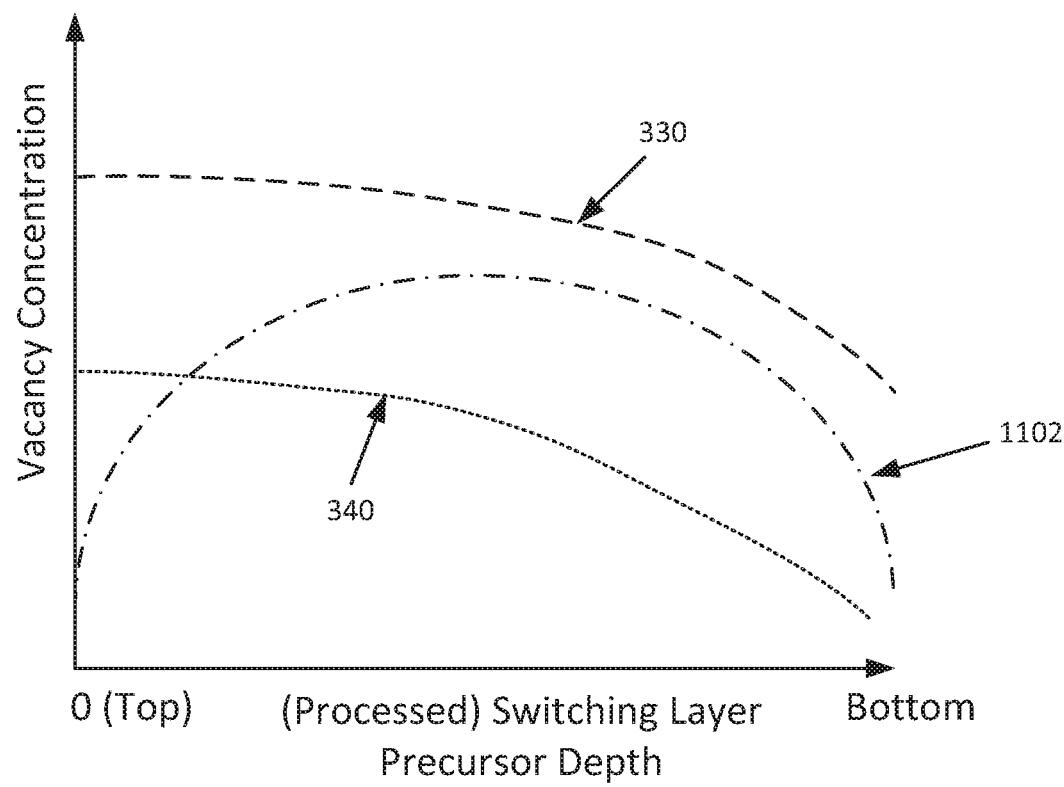

As one example of a parabolic vacancy distribution reference is made to FIG. 11B, which is a plot of vacancy concentration versus (processed) switching layer precursor depth consistent with another example embodiment of the present disclosure. In the embodiment of FIG. 11B, curve 1102 represents a parabolic distribution of oxygen vacancies, in which concentration of oxygen vacancies increases to a maximum between a first switching layer precursor depth to an intermediate switching layer precursor depth, and then decreases from the intermediate switching layer precursor depth to a third switching layer precursor depth. Of course curve 1102 is representative of but one example of a parabolic distribution, and other parabolic distributions such as the inverse of curve 1102 are possible and are envisioned by the present disclosure. For the sake of comparison, curves 330 and 340 (as described above in connection with FIG. 3) are also shown in FIG. 11B.

Figure 11C:
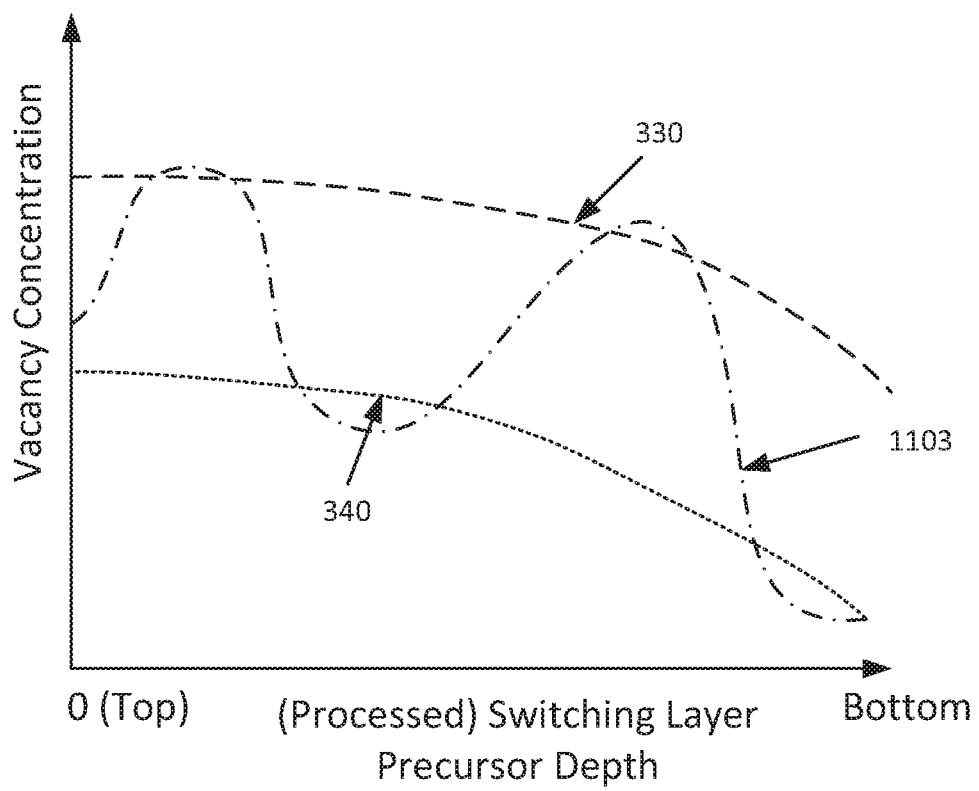

As one example of a polynomial vacancy distribution reference is made to FIG. 11C, which is a plot of vacancy concentration versus (processed) switching layer precursor depth consistent with another example embodiment of the present disclosure. In the embodiment of FIG. 11C, curve 1103 represents a polynomial distribution of oxygen vacancies, in which concentration of oxygen vacancies may vary considerably between the upper (top) and lower (bottom) surfaces of a switching layer precursor. As may be appreciated, a polynomial distribution may be achieved by appropriately setting the thicknesses of OEL and oxide layers in a switching layer precursor, e.g., prior to processing as discussed above. Of course, curve 1103 depicts but one example of a polynomial distribution, and other polynomial distributions may be attained and are envisioned by the present disclosure. For the sake of comparison, curves 330 and 340 (as described above in connection with FIG. 3) are also shown in FIG. 11C.

Figure 11D:
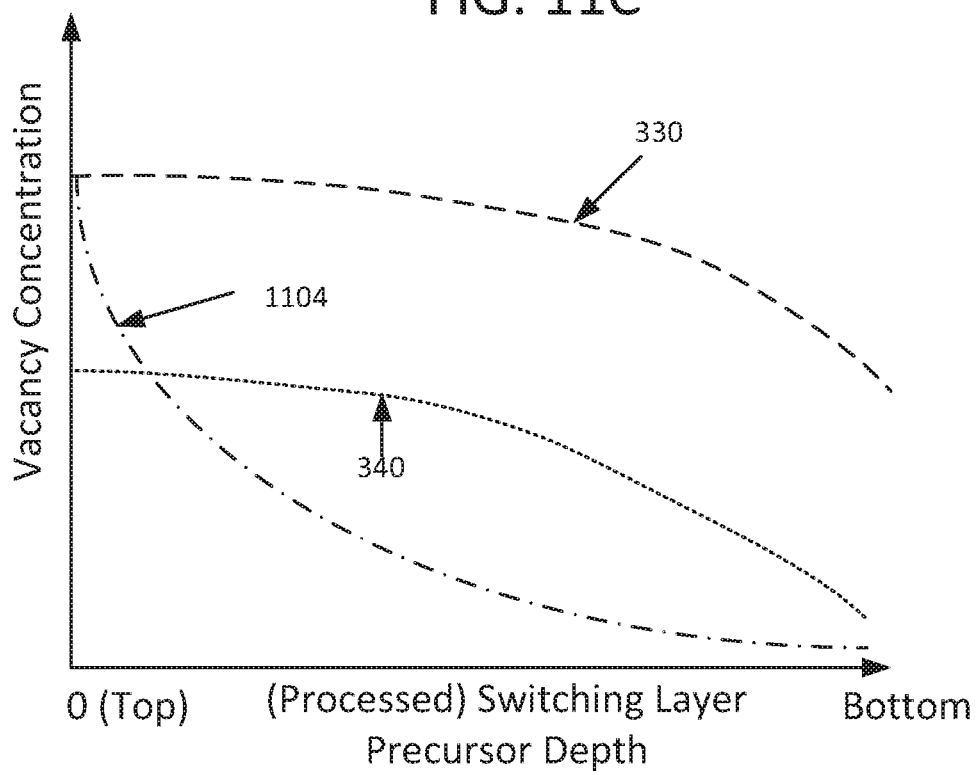

As one example of an exponential vacancy distribution reference is made to FIG. 11D, which is a plot of vacancy concentration versus (processed) switching layer precursor depth consistent with another example embodiment of the present disclosure. In the embodiment of FIG. 11D, curve 1104 represents an exponential distribution of oxygen vacancies, in which concentration of oxygen vacancies may change exponentially with increasing switching layer precursor depth. As may be appreciated, an exponential distribution may be achieved by appropriately setting the thicknesses of OEL and oxide layers in a switching layer precursor, e.g., prior to processing as discussed above. For example, an exponential distribution such as curve 1104 may be attained by forming switching layer precursor 702 from a plurality of alternating oxide and OEL layers, wherein the thickness of the oxide layers (and potentially the OEL layers) is relatively thick at the bottom of switching layer precursor 702, but is relatively thin near the top of switching layer precursor 702. Of course, curve 1104 depicts but one example of an exponential distribution, and other exponential distributions may be attained and are envisioned by the present disclosure. For the sake of comparison, curves 330 and 340 (as described above in connection with FIG. 3) are also shown in FIG. 11D.

Figure 11E:
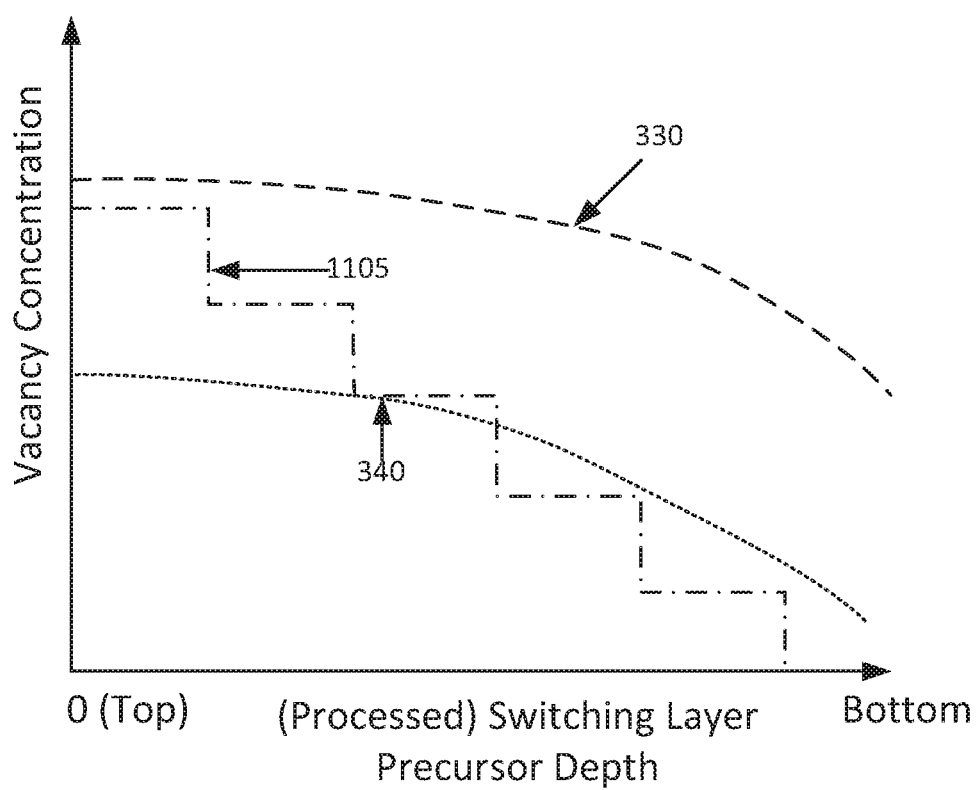

As one example of a stepped vacancy distribution reference is made to FIG. 11E, which is a plot of vacancy concentration versus (processed) switching layer precursor depth consistent with another example embodiment of the present disclosure. In the embodiment of FIG. 11E, curve 1105 represents a stepped distribution of oxygen vacancies, in which concentration of oxygen vacancies decreases in a stepwise manner with increasing switching layer precursor depth. As may be appreciated, a stepwise distribution may be achieved by appropriately setting the thicknesses of OEL and oxide layers in a switching layer precursor, e.g., prior to processing as discussed above. For example, a stepped distribution such as curve 1105 may be attained by forming switching layer precursor 702 from a plurality of alternating oxide and OEL layers, wherein the thickness of the oxide layers (and potentially the OEL layers) is relatively thin at the bottom of switching layer precursor 702, but is relatively thick near the top of switching layer precursor 702. Of course, curve 1105 depicts but one example of a stepped distribution, and other stepped distributions may be attained and are envisioned by the present disclosure. For the sake of comparison, curves 330 and 340 (as described above in connection with FIG. 3) are also shown in FIG. 11E.

Figure 8:
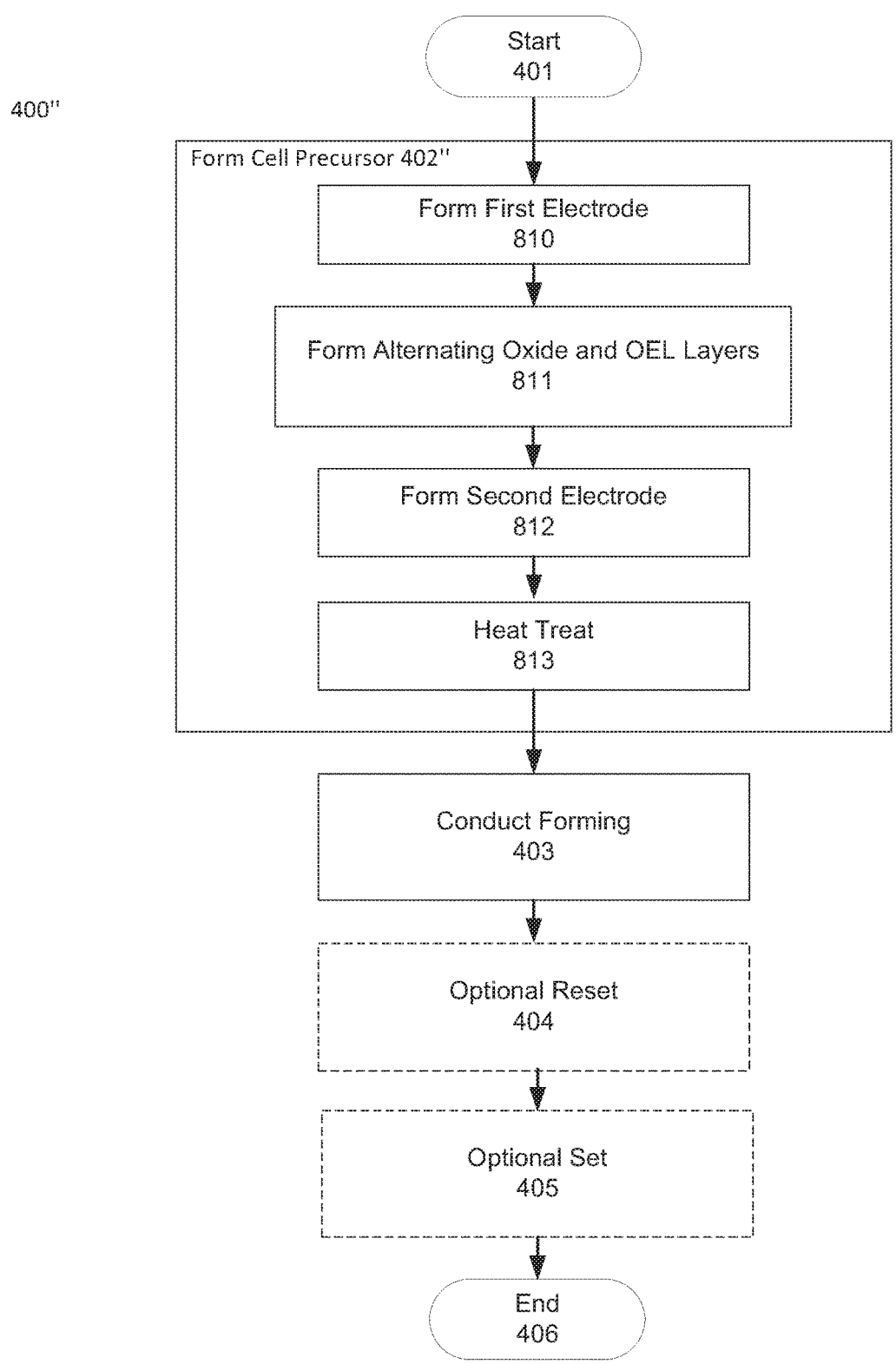
FIG. 8 is a flow chart of example operations of one example method of making a resistive memory cell precursor consistent with the structure of FIGS. 7A and 7B.

Attention is now drawn to FIG. 8, which is a flow diagram of a method of forming a resistive memory cell from a cell precursor consistent with the structure of FIGS. 7A and 7B. As shown, method 400" begins at block 401. The method may then proceed to block 402", wherein a cell precursor consistent with FIGS. 7A and 7B may be formed. Formation of the cell precursor may begin at block 810, wherein a first (bottom) electrode (i.e., bottom electrode 701 of FIG. 7A) may be formed. In this regard, the first electrode may be formed by depositing or otherwise forming a layer of a first electrode material via any suitable electrode forming process, such as via a metallization, chemical vapor deposition, or other suitable process. In some embodiments, the first electrode may be formed by metallizing or otherwise depositing a conductive material on a substrate.

The method may then advance to block 811, wherein a switching layer precursor may be formed on the first (bottom) electrode. In this embodiment, the switching layer precursor may be formed by depositing alternating OEL and oxide layers, such as those described above. In this regard, the oxide layers may be formed by depositing a substantially stoichiometric oxide e.g., via chemical vapor deposition (CVD), metal organic CVD, reactive CVD, atomic layer deposition (ALD), reactive sputtering, combinations thereof, and the like. Without limitation, switching layer precursor in some embodiments is formed by CVD, ALD, reactive sputtering, or a combination thereof. The OEL layers may be formed in a similar manner, e.g., by depositing one or more layers of an oxygen reactive material via chemical vapor deposition (CVD), metal organic CVD, reactive CVD, atomic layer deposition (ALD), reactive sputtering, combinations thereof, and the like. In some embodiments, the oxide layers and switching layers may each be formed by sputtering, wherein a first (e.g., metal) target is sputtered in an oxygen containing atmosphere to form substantially (substantially stoichiometric) oxide layers, whereas a second (e.g., metal) target is sputtered in an inert or other atmosphere to form OEL layers, e.g., of an oxygen reactive material.

Once the switching layer precursor has been formed, the method may proceed to block 812, pursuant to which a second (top) electrode may be formed. As shown in FIG. 7A and discussed above, in some embodiments the second electrode is formed on an upper surface of the switching layer precursor that was formed pursuant to block 811. In this regard, the second (top) electrode may be formed by depositing or otherwise forming a layer of conductive material (which may or may not substantially react with oxygen) on the switching layer precursor. Regardless of its nature, the second electrode may be deposited or otherwise formed by any suitable electrode forming process, such as via a metallization, chemical vapor deposition, or other suitable process. In some embodiments, the second electrode may be formed by metallizing or otherwise depositing a conductive material on the switching layer precursor. As may be appreciated, following the formation of the second electrode, a cell precursor of the structure shown in FIG. 7A may be attained.

Once the second electrode is formed pursuant to block 812 the method may advance to block 813, wherein the resulting structure (i.e., as shown in FIG. 7A) may be processed to react oxygen reactive material in the OEL layers of the switching layer precursor with oxygen in oxide layers of the switching layer precursor. Consistent with the foregoing discussion and as shown in FIG. 8, such processing may be performed by annealing or otherwise heat treating cell precursor 700 at a temperature and for a time that is sufficient to cause the oxygen reactive material within the OEL layers to react with oxygen in the oxide layers of switching layer precursor 702. The result of that reaction in some embodiments is the production of a processed cell precursor 702' including processed OEL and oxide layers, wherein the processed OEL layers include oxidized oxygen reactive material, and the oxide layers include a sub-stoichiometric oxide and a plurality of oxygen vacancies, as generally shown in FIG. 7B. In some embodiments, pursuant to block 813 precursor 700 may be processed by annealing in an inert or slightly reducing atmosphere, as previously described above.

Once cell precursor 700 has been processed pursuant to block 813, the method may proceed to block 403, wherein a forming process may be executed on the resulting structure. More specifically, a forming voltage may be applied to the resulting structure (e.g., FIG. 7B), e.g., via a voltage source, V, which may be connected to top electrode 704. In such embodiments and as previously described, bottom electrode 701 may be connected to ground. In response to the application of the forming voltage, vacancies within processed switching layer precursor 702' may form one or more filaments, resulting in the production of a resistive memory cell including a switching layer with one or more filaments formed therein, resulting in the production of a resistive memory cell.

At this point the method 400" may end, or the resistive memory cell may be toggled between a low resistance (ON) and a high resistance (OFF) state by the application of a voltage, such as a reset and set voltage. In this regard, method 400" may proceed to optional blocks 404 and 405, pursuant to which an optional reset or set voltage may be applied. The nature and characteristics of the application the optional set and reset voltages is the same as previously described, and therefore is not reiterated.

Figure 9:
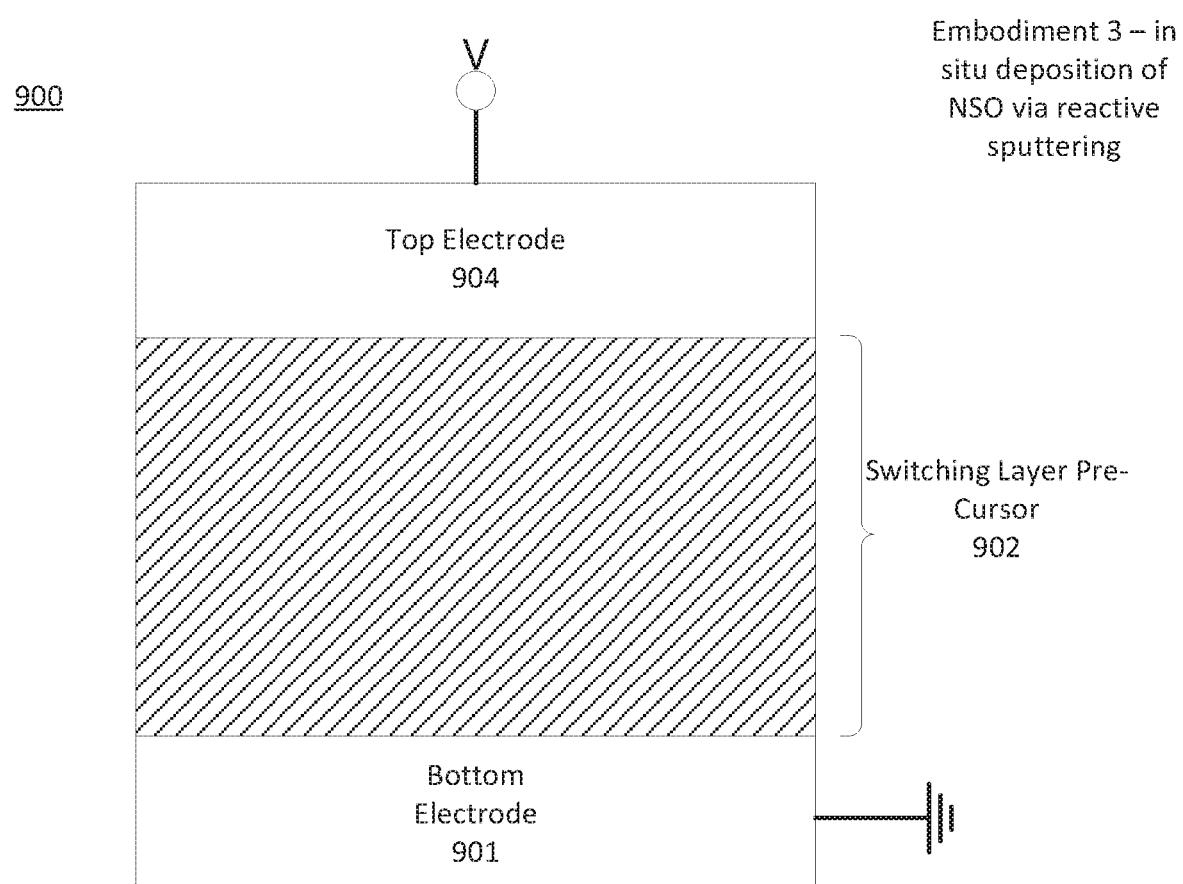
FIG. 9 is a block diagram of the structure of another example of a resistive memory cell precursor consistent with the present disclosure.

Attention is now drawn to FIG. 9, which depicts another example of a cell precursor consistent with the present disclosure. As shown, cell precursor 900 includes a first (bottom) electrode 901, a switching layer precursor 902 formed on bottom electrode 901, and a second (top) electrode 904 formed on an upper surface of switching layer precursor 702. The features and characteristics of bottom and top electrodes 901, 904 are generally the same as those of the bottom and top electrodes of FIGS. 5A and 7A, and therefore are not described again for the sake of brevity.

Consistent with the previously described processed switching layer precursors (e.g., 502', 702') switching layer precursor 902 includes a sub-stoichiometric oxide (such as those noted above) and a plurality of oxygen vacancies, wherein the plurality of oxygen vacancies are distributed in a controlled manner, such as in one of the distributions previously described in connection with FIGS. 11A-11E.

One notable distinction from the previously described precursors however, is that cell precursor 900 (and more specifically, switching layer precursor 902) does not include any oxygen exchange layer(s), or any unreacted or reacted oxygen reactive material originating from an oxygen exchange layer. Rather, switching layer precursor 902 includes one or more layers, regions, etc. of sub-stoichiometric oxide that was formed in situ, i.e., as switching layer precursor 902 is formed on bottom electrode 901. In particular, switching layer precursor includes one or more layers, regions, etc. of sub-stoichiometric oxide that was deposited by reactive sputtering or another suitable technique on bottom electrode 901. As will be described in more detail below, reactive sputtering (also referred to herein as reactive sputter deposition) is a process in which one or more (e.g., metal) targets are sputtered in the presence of a gas (e.g., oxygen) or mixture of gases that will react with the target material to form a reaction product (e.g., an oxide of the target material(s)), wherein the reaction product is formed as a layer on a substrate of interest. Accordingly, reactive sputtering may be used to deposit layers of an oxide of a target on a substrate (e.g., a bottom electrode), wherein the deposited oxide layers have an oxygen content that may be controlled by adjusting the amount of oxygen in the deposition atmosphere.

In some embodiments switching precursor may include a plurality of layers or regions, wherein at least one of the plurality of layers/regions is formed from a substantially stoichiometric oxide, and at least one of the plurality of layers/regions is formed from a sub-stoichiometric oxide. In other non-limiting embodiments, the plurality of layers/regions of switching layer precursor 902 may include at least two layers/regions of a sub-stoichiometric oxide, at least two layers of a substantially stoichiometric oxide, or a combination thereof. In any case, the thickness of the regions of the sub-stoichiometric oxide may be the same or different, and the thickness of the layers/regions substantially stoichiometric oxide may be the same or different. Likewise, the thickness of the layers/regions of sub-stoichiometric oxide may be the same as or differ from the thickness of the layers/regions of substantially stoichiometric oxide.

In one example embodiment, switching layer precursor 902 includes first (e.g., lower) and second (e.g. upper) surfaces and includes a plurality (e.g., at least two) layers/regions of a sub-stoichiometric oxide. In such embodiment, the plurality of layers/regions of subs-stoichiometric oxide includes at first layer/region of sub-stoichiometric oxide and a second layer/region of sub-stoichiometric oxide, wherein the first and second layers/regions of sub-stoichiometric oxide are proximate the lower and upper surfaces, respectively, of switching layer precursor 902. In some instances, the first and second layers/regions of sub-stoichiometric oxide may be separated by one or more regions of a substantially stoichiometric oxide. In such instances, the thickness of the first and second layers/regions of sub-stoichiometric oxide may be the same or different. In some embodiments the thickness of the first layer/region of sub-stoichiometric oxide is greater than the thickness of the second layer/region of sub-stoichiometric oxide. In other embodiments, the thickness of the first layer/region of sub-stoichiometric oxide is less than the thickness of the second layer/region of sub-stoichiometric oxide.

Another notable distinction of precursor 900 is that unlike precursors 500 and 700, processing (e.g., by heat treatment) is not required to form oxygen vacancies, e.g., via the reaction of oxygen reactive material of an OEL layer and oxygen in a one or more layers of substantially stoichiometric oxide. As may be appreciated, this can simplify the production of a resistive memory cell by avoiding the need to anneal or otherwise heat treat a cell precursor. Moreover in some embodiments, this may limit or avoid variations and/or inconsistencies in the formation of oxygen vacancies within a switching layer precursor that may be attributable to the heat treatment process.

Figure 10:
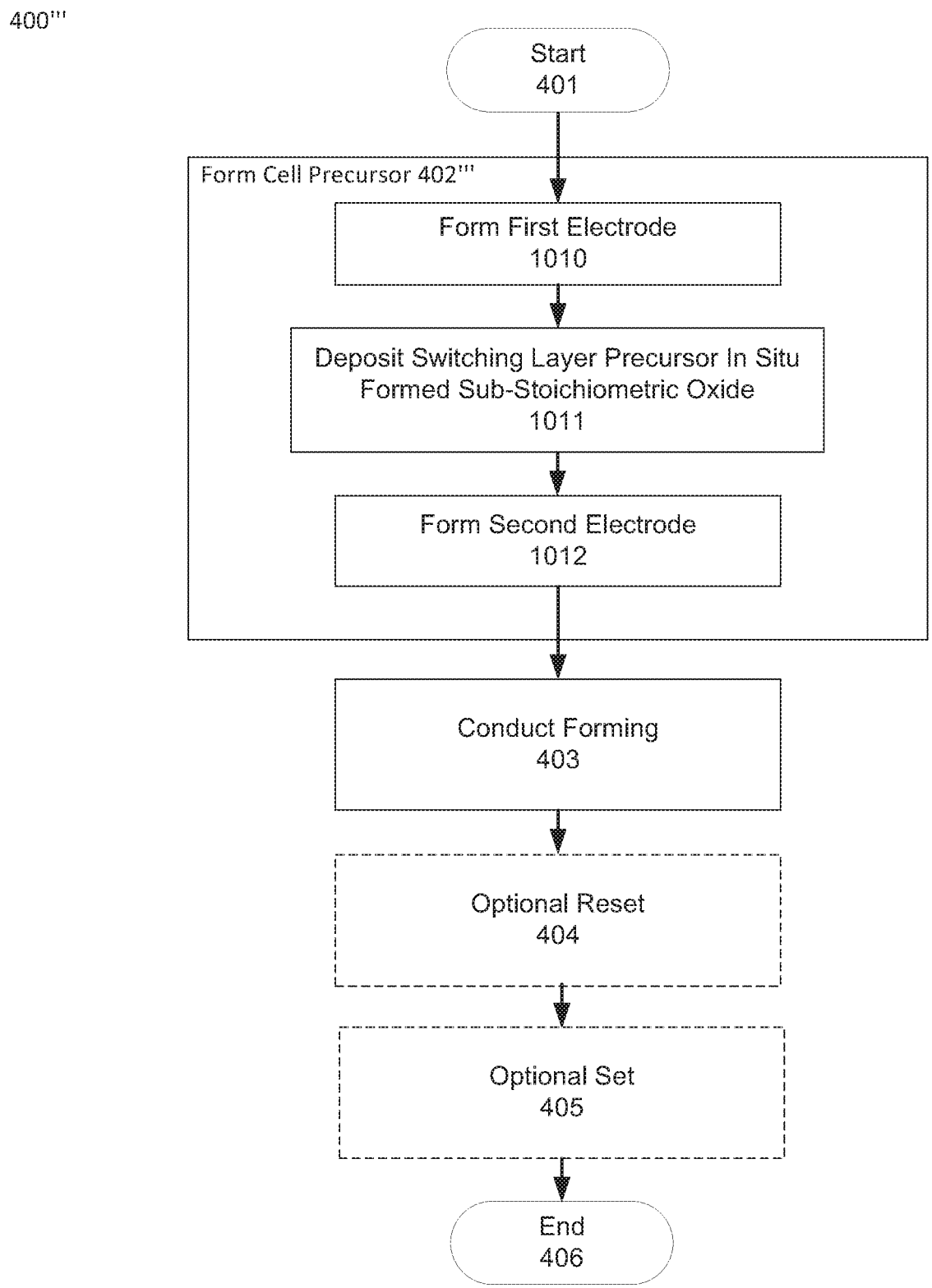
FIG. 10 is a flow chart of example operations of one example method of making a resistive memory cell precursor consistent with the structure of FIG. 9.

Attention is now drawn to FIG. 10, which is a flow diagram of a method of forming a resistive memory cell from a cell precursor consistent with the structure of FIG. 9. As shown, method 400''' begins at block 401. The method may then proceed to block 402''', wherein a cell precursor consistent with FIG. 9 may be formed. Formation of the cell precursor may begin at block 1010, wherein a first (bottom) electrode (i.e., bottom electrode 901 of FIG. 9) may be formed. In this regard, the first electrode may be formed by depositing or otherwise forming a layer of a first electrode material via any suitable electrode forming process, such as via a metallization, chemical vapor deposition, or other suitable process. In some embodiments, the first electrode may be formed by metallizing or otherwise depositing a conductive material on a substrate.

The method may then advance to block 1011, wherein a switching layer precursor may be formed on the first (bottom) electrode. In this embodiment, the switching layer precursor may be formed by depositing one or more regions/layers of sub-stoichiometric oxide on the first electrode, optionally in combination with one or more substantially stoichiometric oxide layers/regions, such as those described above. In this regard, the sub-stoichiometric and/or substantially stoichiometric oxide layers may be formed via any suitable deposition technique, such as via reactive sputter deposition, atomic layer deposition, combinations thereof, and the like.

Without limitation, in some embodiments one or more regions of sub-stoichiometric and/or substantially stoichiometric oxide are formed by reactive sputter deposition, in which one or more metals are deposited in an oxygen containing atmosphere. For example, in some instances a sub-stoichiometric oxide may be formed by reactive sputter deposition, in which sputtering from one or more metal targets may be performed in an oxygen containing atmosphere. Non-limiting examples of a suitable oxygen containing atmosphere includes an atmosphere containing a partial pressure of oxygen that ranges from greater than 0 to about 80% of the total pressure of the deposition atmosphere, such as from greater than 0 to about 20%, or even from greater than 0 to about 5% of the total pressure of the deposition atmosphere. The oxygen containing atmosphere may also contain nitrogen or an inert gas (e.g. argon, krypton, etc.), wherein the partial pressure of nitrogen and/or inert gas ranges from about 5 to about 95% of the total pressure of the oxygen containing atmosphere. In any case, the total pressure of the oxygen containing atmosphere may range from about 0.5 to about 20 mTorr, such as about 1 to about 5 mTorr.

As may be appreciated, the amount of oxygen in the deposited oxide may be controlled by exerting control over the amount of oxygen contained in the atmosphere used during deposition. For example, increasing the amount of oxygen in the deposition atmosphere may increase the amount of oxygen in the deposited oxide. At or above an upper threshold oxygen content (partial pressure), the deposited oxide may be in the form of a fully stoichiometric oxide. As the amount of oxygen is decreased below the first threshold, a sub-stoichiometric oxide (e.g. of the sputtering target(s) used) may be deposited. At or below a lower threshold oxygen content (partial pressure), an oxide may no longer be deposited. Rather, a metallic or substantially metallic layer may be formed. The amount of oxygen in the atmosphere may be controlled by controlling the flow rate of oxygen into the deposition chamber/atmosphere. In this regard, the flow rate of oxygen into the deposition chamber/atmosphere may range for example, from greater than 0 to about 250 standard cubic centimeters per minute (SCCM), such as from about 1 to about 100 SCCM, from about 1 to about 75 SCCM, from about 1 to about 60 SCCM, or even from about 1 to about 50 SCCM.

Put in other terms, sub-stoichiometric and/or substantially stoichiometric layers/regions may be formed by depositing one or more metals while controlling the relative amount of oxygen in the surrounding deposition atmosphere. In the case of sputtering or other deposition processes, the formation of sub-stoichiometric or stoichiometric oxide in some embodiments may be determined or otherwise evidenced by a measurement of the target voltage. When the oxygen flow rate during deposition is 0 or low, the target voltage may be relatively high, indicating the formation of a metallic or highly metallic film. As oxygen content/flow rate is increased above a first (lower) threshold, sub-stoichiometric oxide may be deposited, and may be evidenced by a drop in the target voltage. As oxygen content is increased above a second (upper) threshold flow rate, substantially stoichiometric oxide may be deposited, as may be evidenced by a significant drop in target voltage.

To illustrate the foregoing concept, in some embodiments the switching layer includes one or more regions/layers of sub-stoichiometric hafnium oxide, which is/are formed by sputtering a hafnium metal target in oxygen containing atmosphere. As shown in table 1 below, a wide variety of sub-stoichiometric oxides may be sputter deposited by appropriate adjustment of the oxygen flow rate.

TABLE 1

Reactive Sputter Deposition of Sub-Stoichiometric Hafnium Oxide from a Hafnium Metal Target

| Sample | Target | Atmosphere | Deposited Oxide | % Hf | % O | O:Hf ratio | Formula |
|---|---|---|---|---|---|---|---|
| 1 | Hf | 18 SCCM Argon and 20 SCCM $O_2$ | $HfO_x$ | 56.7 | 43.3 | 0.8 | $HfO_{0.8}$ |
| 2 | Hf | 18 SCCM Argon and 30 SCCM $O_2$ | $HfO_x$ | 43.8 | 56.2 | 1.3 | $HfO_{1.3}$ |
| 3 | Hf | 18 SCCM Argon and 50 SCCM $O_2$ | $HfO_x$ | 38.5 | 61.5 | 1.6 | $HfO_{1.6}$ |
| 4 | HF | 18 SCCM Argon and 60 SCCM $O_2$ | $HfO_x$ | 34.3 | 65.7 | 1.9 | $HfO_{1.9}$ |

As may therefore be appreciated, by adjusting the amount of oxygen in the deposition atmosphere, substantial control may be exercised over the oxygen content of the resulting deposited oxide and thus the amount and distribution of oxygen vacancies (if any) contained therein. Accordingly, through appropriate control of the oxygen content/flow rate, switching layer 902 may be formed via the deposition of one or more oxide layer(s) regions, wherein the amount of oxygen in each region (and hence the concentration of oxygen vacancies) may be controlled so as to achieve a desired oxygen vacancy distribution. For example, through appropriate control over the oxygen content/flow rate, switching layer precursor 902 may be formed to include a plurality of oxygen vacancies that are distributed in a linear distribution, a parabolic distribution, a logarithmic distribution, an exponential distribution, a stepped distribution, a polynomial distribution, an asymptotic distribution, and combinations thereof, as generally shown in FIGS. 11A-E.

Once the switching layer precursor has been formed, the method may proceed to block 1012, pursuant to which a second (top) electrode may be formed. As shown in FIG. 9 and discussed above, in some embodiments the second electrode is formed on an upper surface of the switching layer precursor that was formed pursuant to block 1011, e.g., switching layer precursor 902. In this regard, the second (top) electrode may be formed by depositing or otherwise forming a layer of conductive material (which may or may not substantially react with oxygen) on the switching layer precursor. Regardless of its nature, the second electrode may be deposited or otherwise formed by any suitable electrode forming process, such as via a metallization, chemical vapor deposition, or other suitable process. In some embodiments, the second electrode may be formed by metallizing or otherwise depositing a conductive material on the switching layer precursor. As may be appreciated, following the formation of the second electrode, a cell precursor of the structure shown in FIG. 9 may be attained.

Once a cell precursor has been formed the method may proceed to block 403, wherein a forming process may be executed. More specifically, a forming voltage may be applied to the resulting structure (e.g., FIG. 9), e.g., via a voltage source, V, which may be connected to top electrode 904. In such embodiments and as previously described, bottom electrode 901 may be connected to ground. In response to the application of the forming voltage, vacancies within switching layer precursor 902 may form one or more filaments, resulting in the production of a resistive memory cell including a switching layer with one or more filaments formed therein, resulting in the production of a resistive memory cell.

At this point the method 400''' may end, or the resistive memory cell may be toggled between a low resistance (ON) and a high resistance (OFF) state by the application of a voltage, such as a reset and set voltage. In this regard, method 400''' may proceed to optional blocks 404 and 405, pursuant to which an optional reset or set voltage may be applied. The nature and characteristics of the application the optional set and reset voltages is the same as previously described, and therefore is not reiterated.

To further explain the foregoing concepts the present disclosure will now proceed to describe one example of a specific process of forming a resistive memory cell in the context of an integrated circuit, a resistive random access memory, or another device. Reference is therefore made to FIGS. 12A-E, which stepwise illustrate the formation of a resistive memory cell consistent with the present disclosure on a substrate, such as a substrate of an integrated circuit device.

Figure 12A:
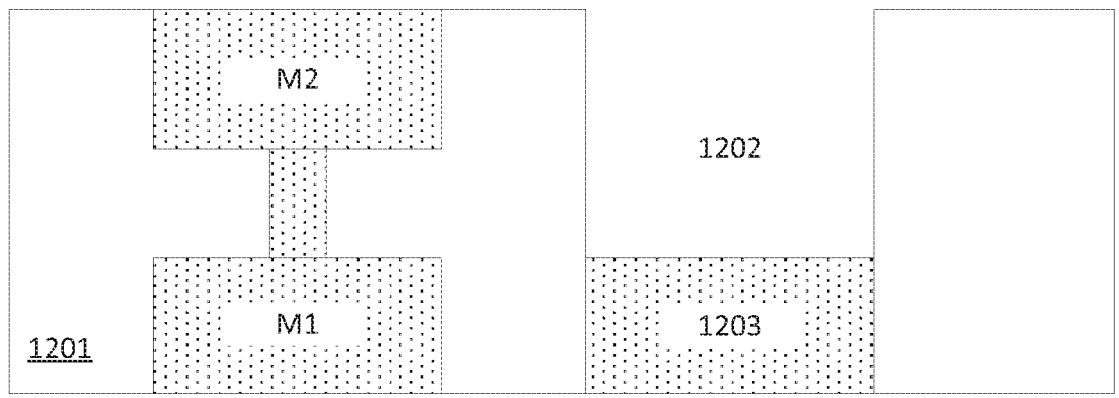
FIGS. 12A-12E stepwise illustrate the formation of an integrated circuit including a resistive memory cell consistent with the present disclosure.

As shown in FIG. 12A, the method may being with the provision of a substrate for the subsequent formation of resistive memory cells. In this example, the substrate 1201 includes a trench 1202 formed therein. In general, substrate 1201 may include or be in the form of one or more layers of dielectric or insulating material. Non-limiting examples of suitable dielectric/insulating materials that may be used to form substrate 1001 include insulating oxides such as silicon dioxide ($SiO_2$), carbon doped oxide (CDO), silicon nitride (SiN), organic polymers such as polyflurocyclobutane or polytetrafluoroethylene (PTFE), fluorosilicate glass (FSG), organosilicates such as silsesquioxane and siloxane, organosilicate glass, combinations thereof, and the like. Trench 1202 may be formed in substrate 1001 in any suitable manner. For example, trench 1202 may be formed by etching substrate 1001 with a selective etching process.

As further shown in FIG. 12A, two levels of interconnects (M1, M2) are formed in substrate 1201. In addition, an interconnect 1203 is formed within trench 1202. As shown, interconnects M1, M2 and 1203 are surrounded by the dielectric/insulating material(s) forming substrate 1201. Interconnects M1, M2, and 1203 may be formed from conductive materials (e.g., metals such as copper, cobalt, molybdenum, rhodium, beryllium, chromium, manganese, aluminum, silver, gold, combinations thereof, and the like), which may be deposited or otherwise formed in any suitable manner (e.g., via a metallization process). The dimensions of trench 1202, interconnects M1, M2 and 1203 may be tailored to a given target application or end use. Although not shown, interconnect 1203 in some embodiments may be connected or otherwise coupled to electrical ground.

Although only one trench 1202 is depicted in FIG. 12A, it should be understood that such illustration is for the sake of example only and that any suitable number of trenches 1002 may be formed. Indeed the present disclosure envisions embodiments in which a plurality (e.g., hundreds, thousands, millions, or even billions) of trenches 1202 are formed in substrate 1201, wherein each trench is to house a resistive memory cell.

Figure 12B:
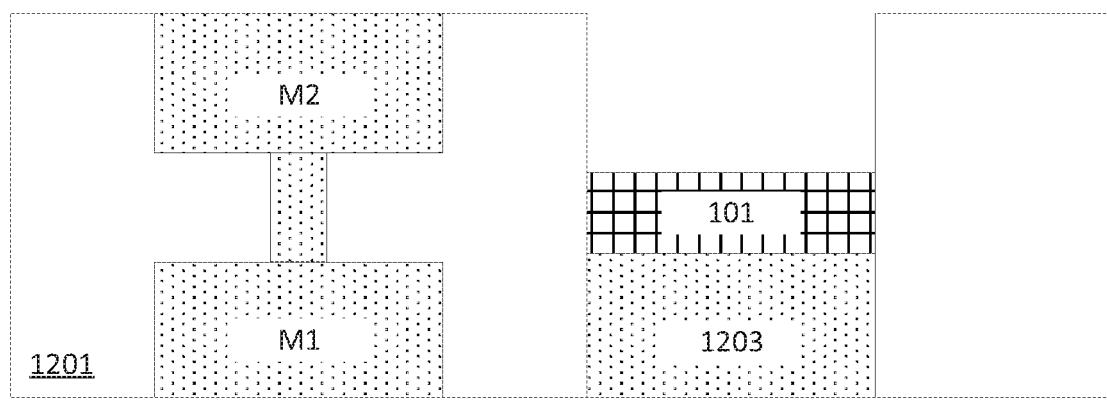

Once a substrate is provided the method may proceed, and a bottom electrode maybe formed. This concept is shown in FIG. 12B, which depicts bottom (first) electrode 101 as being formed within trench 1202, and in this case on an upper surface of interconnect 1203. Bottom electrode 101 may be formed from or include electrode materials such as those described above in connection with the bottom electrodes of FIGS. 5A, 7A, and 9, and may be deposited in any suitable manner. For example, a conformal deposition process may be used to form a conformal layer of bottom electrode 101 over the surface of substrate 1201 and within trench 1202. Following such deposition, a planarization process may be applied to remove the portion of the conformal layer from the regions of substrate 1201 outside of trench 1202. If necessary, a selective etching process may then be applied to etch bottom electrode 101 within trench 1202 to a desired thickness, and/or to remove portions of bottom electrode 101 that may be formed on the sidewalls of trench 1202.

Figure 12C:
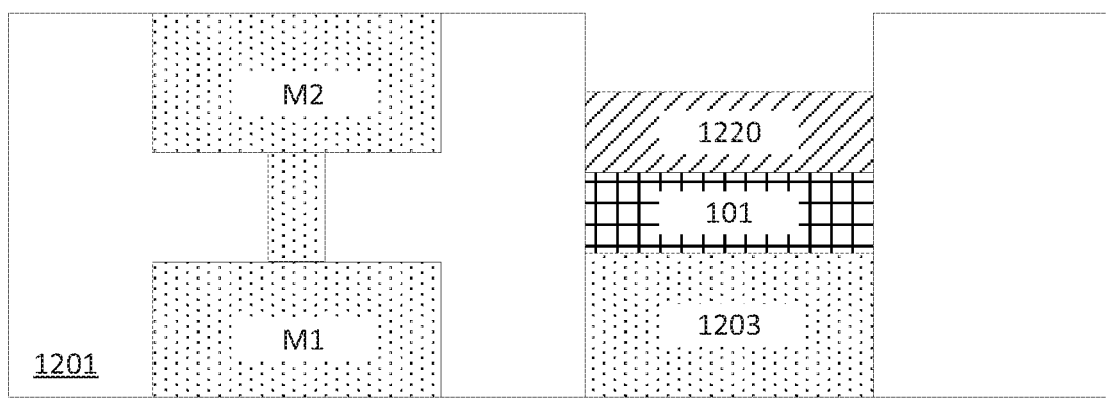

Once a bottom electrode is provided the method may proceed, and a switching layer precursor may be formed. This concept is shown in FIG. 12C, which depicts the formation of switching layer precursor 1220 within trench 1202. Switching layer precursor 1220 may be any suitable switching layer precursor, such as those described above in connection with FIGS. 5A, 7A, and 9 (including any relevant OEL layers). Switching layer precursor 1220 may therefore include one or more layers/regions of sub-stoichiometric and/or substantially stoichiometric oxide, optionally in combination with one or more OEL layers. Switching layer precursor 1220 (and any relevant OEL layers) may be deposited as previously described in connection with FIGS. 5A, 7A, and 9. Thus for example, switching layer precursor 1220 may be formed by depositing a conformal sub-stoichiometric, substantially stoichiometric, and/or OEL layers on bottom electrode 101 and the surface of substrate 1201, e.g., via a reactive sputtering or another suitable deposition process. In such instances a planarization process may be applied to remove the deposited conformal layer(s) from the upper surface of substrate 1201. A selective etching or other removal process may also be applied to remove deposited switching layer precursor material from the sidewall of trench 1202, resulting in the structure of FIG. 12C.

Figure 12D:
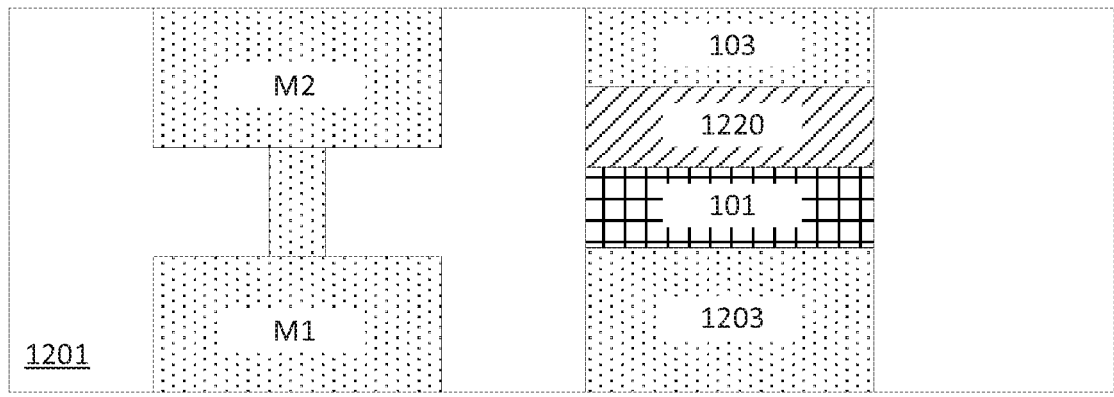

The method may then proceed by the formation of a top electrode on the switching layer precursor (or a relevant OEL layer thereof). This concept is illustrated in FIG. 12D, which illustrates the formation of top electrode 103 on an upper surface of switching layer precursor 1220. The nature of the materials that may be used to form top electrode 103 are the same as those previously described, and so are not reiterated. Likewise, top electrode 103 may be formed in much the same manner as bottom electrode 102. Thus for example, top electrode 103 may be formed by a metallization process that creates a conformal layer of electrode material on substrate 1001 and the upper surface of switching layer precursor 1220. Planarization and/or etching processes may then be used to remove electrode material from the surface of substrate 1201 and, if desired/necessary, from the sidewalls of trench 1202, resulting in the production of the structure shown in FIG. 12D.

Figure 12E:
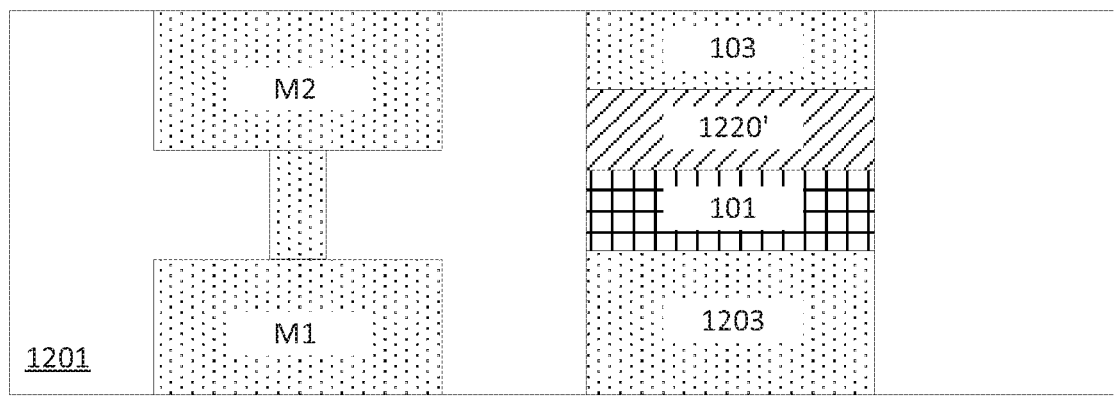

In instances where the cell precursor is consistent with the embodiment of FIG. 9 discussed above, no further processing may be necessary before the execution of a forming process. If the cell precursor is consistent with the embodiments of FIG. 5A or 7A however, the structure of FIG. 12D may be processed (e.g., with an annealing or other heat treatment process) to react oxygen reactive materials in relevant OEL layer(s) with oxygen in relevant substantially stoichiometric oxide layer(s) to produce a sub-stoichiometric oxide containing a plurality of vacancies, as previously described. In any case, the method may proceed with by the execution of a forming process, during which a forming voltage may be applied. Consistent with the foregoing discussion, application of the forming voltage may cause at least a portion of the oxygen vacancies within switching layer precursor 1220 to reorganize, resulting in the production of a switching layer 1220' including one or more filaments, as shown in FIG. 12E. As noted previously, reset and set voltages may then be applied to break and reform, respectively, one or more of the filament(s) within switching layer 1220'.

Figure 13:
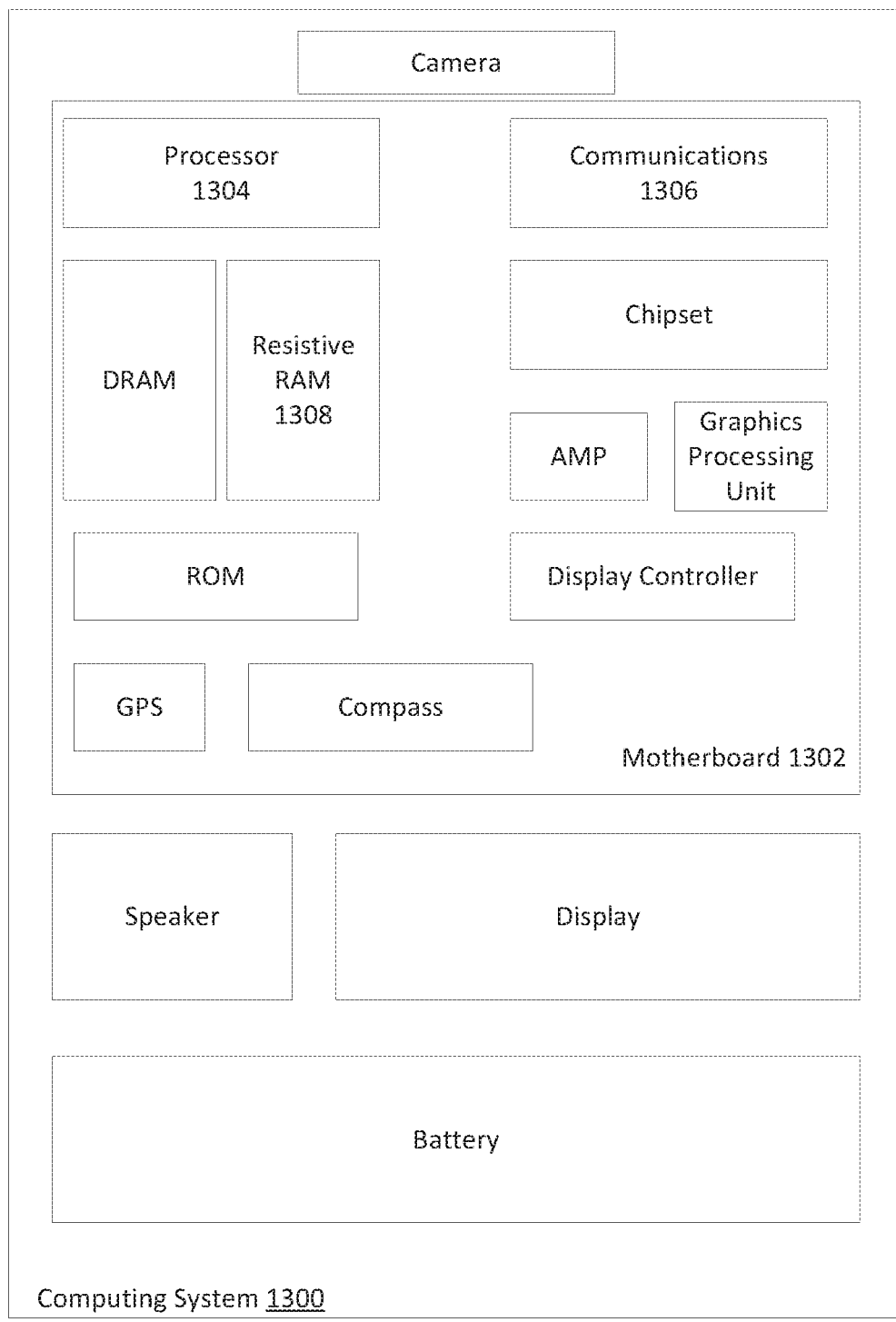
FIG. 13 depicts one example of a computing system including a resistive memory including one or more resistive memory cells consistent with the present disclosure.

Another aspect of the present disclosure relates to computing systems including an integrated circuit (e.g., a resistive memory device) including resistive memory cells consistent with the present disclosure. In this regard reference is made to FIG. 13, which illustrates a computing system 1300 implemented with integrated circuit structures or devices formed using the techniques disclosed herein, in accordance with an example embodiment. As can be seen, the computing system 1300 houses motherboard 1302. Motherboard 1302 may include a number of components, including, but not limited to, processor 1304 and at least one communication chip 1306, each of which can be physically and electrically coupled to motherboard 1302, or otherwise integrated therein. As will be appreciated, motherboard 1302 may be, for example, any printed circuit board, whether a main board, a daughterboard mounted on a main board, or the only board of system 1300, etc.

Depending on its applications, computing system 1300 may include one or more other components that may or may not be physically and electrically coupled to the motherboard 1302. These other components may include, but are not limited to, volatile memory (e.g., DRAM), non-volatile memory (e.g., ROM, ReRAM 1008, etc.), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1300 may include one or more integrated circuit structures or devices (e.g., one or more resistive memory cells) formed using the techniques described herein.

Communication chip 1306 enables wireless communications for the transfer of data to and from the computing system 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 1306 may implement any of a number of wireless standards or protocols, including, but not limited to, Wi-Fi (IEEE 802.11 family), WiMAX (IEEE 802.16 family), IEEE 802.20, long term evolution (LTE), Ev-25 DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1300 may include a plurality of communication chips 1006. For instance, a first communication chip 1306 may be dedicated to shorter range wireless communications such as Wi-Fi and Bluetooth and a second communication chip 1306 may be dedicated to longer range wireless communications such as GPS, EDGE, GPRS, CDMA, WiMAX, LTE, Ev-DO, and others.

Processor 1304 of the computing system 1300 includes an integrated circuit die packaged therein. In some embodiments, the integrated circuit die of processor 1304 includes onboard circuitry that is implemented with one or more integrated circuit structures or devices (e.g., one or more resistive memory cells) consistent with the present disclosure. The term "processor" may refer to any device or portion of a device that processes, for instance, electronic data from registers and/or memory to transform that electronic data into other electronic data that may be stored in registers and/or memory.

Communication chip 1306 also may include an integrated circuit die packaged within the communication chip 1306. In accordance with some example embodiments, the integrated circuit die of communication chip 1306 includes one or more integrated circuit structures or devices (e.g., one or more resistive memory cells) consistent with the present disclosure.

In various implementations, computing device 1300 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices (e.g., one or more non-planar resistive memory cells) consistent with the present disclosure.

EXAMPLES

Example 1

According to this example there is provided a method of forming a resistive memory cell, including: forming a cell precursor at least in part by: providing a first electrode including a first electrode material; forming, without the use of an oxygen exchange layer, a switching layer precursor on the first electrode, the switching layer precursor including a sub-stoichiometric oxide and a plurality of oxygen vacancies, wherein the oxygen vacancies have controlled distribution defined between a first and second surface of the switching layer precursor; and forming a second electrode on the switching layer precursor, the second electrode including a second electrode material; and executing a forming process to convert the switching layer precursor to a switching layer in which the oxygen vacancies form least one filament that provides a low resistance pathway between the first electrode and the second electrode.

Example 2

This example includes any or all of the features of example 1, wherein the controlled distribution is selected from the group consisting of a linear distribution, a parabolic distribution, a logarithmic distribution, an exponential distribution, a stepped distribution, a polynomial distribution, an asymptotic distribution, and combinations thereof.

Example 3

This example includes any or all of the features of example 2, wherein the controlled distribution is a stepped distribution, and forming the switching layer precursor includes depositing a plurality of layers of the sub-stoichiometric oxide and at least one corresponding substantially stoichiometric oxide layer.

Example 4

This example includes any or all of the features of example 3, wherein: the first and second surfaces are a lower and an upper surface, respectively, of the switching layer precursor; the plurality of layers of the sub-stoichiometric oxide includes at least a first sub-stoichiometric oxide layer proximate the lower surface and a second sub-stoichiometric oxide layer proximate the upper surface, the first and second sub-stoichiometric oxide layers having respective first and second thicknesses; and the first and second thicknesses are the same or different.

Example 5

This example includes any or all of the features of example 4, wherein the second thickness is greater than the first thickness.

Example 6

This example includes any or all of the features of example 4, wherein the first thickness is greater than the second thickness.

Example 7

This example includes any or all of the features of example 2, wherein the controlled distribution is a polynomial distribution.

Example 8

This example includes any or all of the features of example 2, wherein the controlled distribution is a linear distribution.

Example 9

This example includes any or all of the features of example 2, wherein the first surface is a lower surface of the switching layer precursor, and the second surface is an upper surface of the switching layer precursor.

Example 10

This example includes any or all of the features of example 1, wherein forming the switching layer precursor includes sputter depositing a metal target in an oxygen containing atmosphere so as to deposit the switching layer precursor on the first electrode, and the method further includes controlling the amount of oxygen in the oxygen containing atmosphere as the switching layer precursor is deposited, so as to obtain the controlled distribution of oxygen vacancies.

Example 11

This example includes any or all of the features of example 1, wherein the sub-stoichiometric oxide is one or more sub-stoichiometric metal oxides selected from the group consisting of sub-stoichiometric: hafnium oxide, tantalum oxide, nickel oxide, tungsten (III) oxide, tungsten (IV) oxide, tungsten (VI) oxide, tungsten pentoxide, titanium oxide, zirconium oxide, vanadium oxide, copper (II) oxide, aluminum oxide, or a combination thereof.

Example 12

This example includes any or all of the features of example 1, wherein after execution of the forming process, the method further includes executing a reset process to break the at least one filament.

Example 13

This example includes any or all of the features of example 12, wherein after execution of the reset process, the method further includes executing a set process to reform the at least one filament.

Example 14

This example includes any or all of the features of example 1, wherein forming the cell precursor further includes providing a substrate including a dielectric material having a trench formed therein, wherein: at least a portion of the first electrode is provided in the trench; depositing the switching layer precursor includes depositing, via the reactive sputter deposition, one or more layers of a sub-stoichiometric oxide within the trench, such that first and second sides of the switching layer precursor respectively contact opposing sidewalls of the trench; and forming the second electrode includes depositing the second electrode material on the second surface of the switching layer precursor, the second surface being an upper surface of the switching layer precursor.

Example 15

This example includes any or all of the features of example 1, wherein the second electrode material includes a conductive material that does not substantially react with oxygen in the switching layer, the switching layer precursor, or a combination thereof.

Example 16

According to this example there is provided a resistive memory cell precursor, including: a first electrode including a first electrode material; a switching layer precursor on the first electrode, the switching layer precursor having opposing first and second surfaces; and a second electrode on the switching layer precursor, the second electrode including a second electrode material; wherein the switching layer precursor includes a sub-stoichiometric oxide and a plurality of oxygen vacancies, the oxygen vacancies being present in a controlled distribution between about the first and second surfaces without the use of an oxygen exchange layer; and wherein the switching layer precursor is configured such that, in response to application of a forming voltage, the switching layer precursor converts to a switching layer in which at least a portion of the plurality of oxygen vacancies form at least one filament providing a low resistance pathway between the first electrode and the second electrode.

Example 17

This example includes any or all of the features of example 16, wherein the controlled distribution is selected from the group consisting of a linear distribution, a parabolic distribution, a logarithmic distribution, a stepped distribution, a polynomial distribution, an asymptotic distribution, and combinations thereof.

Example 18

This example includes any or all of the features of example 17, wherein the controlled distribution is a stepped distribution, and the switching layer precursor includes a plurality of layers of the sub-stoichiometric oxide and at least one corresponding substantially stoichiometric oxide layer.

Example 19

This example includes any or all of the features of example 18, wherein: the first and second surfaces are a lower and an upper surface, respectively, of the switching layer precursor; the plurality of layers of the sub-stoichiometric oxide includes at least a first sub-stoichiometric oxide layer proximate the lower surface and a second sub-stoichiometric oxide layer proximate the upper surface, the first and second sub-stoichiometric oxide layers having respective first and second thicknesses; and the first and second thicknesses are the same or different.

Example 20

This example includes any or all of the features of example 19, wherein the second thickness is greater than the first thickness.

Example 21

This example includes any or all of the features of example 19, wherein the first thickness is greater than the second thickness.

Example 22

This example includes any or all of the features of example 17, wherein the controlled distribution is a polynomial distribution.

Example 23

This example includes any or all of the features of example 17, wherein the controlled distribution is a linear distribution.

Example 24

This example includes any or all of the features of example 16, wherein the first and second surfaces are a lower and an upper surface, respectively, of the switching layer precursor.

Example 25

This example includes any or all of the features of example 16, wherein the sub-stoichiometric oxide is one or more sub-stoichiometric metal oxides selected from the group consisting of sub-stoichiometric: hafnium oxide, tantalum oxide, nickel oxide, tungsten (III) oxide, tungsten (IV) oxide, tungsten (VI) oxide, tungsten pentoxide, titanium oxide, zirconium oxide, vanadium oxide, copper (II) oxide, aluminum oxide, or a combination thereof.

Example 26

This example includes any or all of the features of example 16, further including a substrate including a dielectric material having a trench formed therein, wherein: at least a portion of the switching layer precursor is disposed within the trench.

Example 27

This example includes any or all of the features of example 16, wherein the second electrode material includes a conductive material that does not substantially react with oxygen.

Example 28

According to this example there is provided a method of forming a resistive memory cell, including: forming a cell precursor at least in part by: providing a first electrode including a first electrode material; forming a switching layer precursor on the first electrode, the switching layer precursor including a plurality of alternating oxide and oxygen exchange layers, the oxide layer including a substantially stoichiometric oxide, the oxygen exchange layers including an oxygen reactive material; forming a second electrode on the switching layer precursor, the second electrode including a second electrode material; and executing a heat treatment process to convert at least a portion of the substantially stoichiometric oxide to a sub-stoichiometric oxide including a plurality of oxygen vacancies, and to convert at least a portion of the oxygen reactive material to reacted oxygen reactive material, the oxygen vacancies having a controlled distribution defined between a first and second surface of the switching layer precursor; and executing a forming process to convert the switching layer precursor to a switching layer in which at least a portion of the oxygen vacancies form least one filament that provides a low resistance pathway between the first electrode and the second electrode.

Example 29

This example includes any or all of the features of example 28, wherein the controlled distribution is selected from the group consisting of a linear distribution, a parabolic distribution, a logarithmic distribution, a stepped distribution, a polynomial distribution, an asymptotic distribution, and combinations thereof.

Example 30

This example includes any or all of the features of example 28, wherein: the plurality of alternating oxide and oxygen exchange layers includes at least a first and second oxide layers having respective first and second oxide layer thicknesses; and the first and second oxide layer thicknesses are the same or different.

Example 31

This example includes any or all of the features of example 30, wherein: the first and second surfaces are a lower and upper surface, respectively, of the switching layer precursor; the first oxide layer is proximate the lower surface; the second oxide layer is proximate the upper surface; the first and second oxide layer thicknesses are different; and the controlled distribution is a stepped distribution.

Example 32

This example includes any or all of the features of example 31, wherein the first oxide layer thickness is less than the second oxide layer thickness.

Example 33

This example includes any or all of the features of example 31, wherein the first oxide layer thickness is greater than the second oxide layer thickness.

Example 34

This example includes any or all of the features of example 28, wherein: the plurality of alternating oxide and oxygen exchange layers includes at least a first and second oxygen exchange layers having respective first and second OEL layer thicknesses; and the first and second OEL layer thicknesses are the same or different.

Example 35

This example includes any or all of the features of example 34, wherein the first and second surfaces are a lower and upper surface, respectively, of the switching layer precursor; the first oxygen exchange layer is proximate the lower surface; the second oxygen exchange is proximate the upper surface; and the first and second OEL layer thicknesses are different.

Example 36

This example includes any or all of the features of example 28, wherein: the plurality of alternating oxide and oxygen exchange layers includes at least four oxide layers and at least three oxygen exchange layers; and each of the oxygen exchange layers is between at least two of the oxide layers.

Example 37

This example includes any or all of the features of example 28, wherein: the reacted oxygen reactive material is an oxide of the oxygen reactive material; and during the heat treatment process, substantially all of the oxygen reactive material in the oxygen exchange layers is converted to the oxide of the oxygen reactive material.

Example 38

This example includes any or all of the features of example 37, wherein during the heat treatment process, all of the oxygen reactive material in the oxygen exchange layers is converted to the oxide of the oxygen reactive material.

Example 39

This example includes any or all of the features of example 28, wherein the sub-stoichiometric oxide is one or more sub-stoichiometric metal oxides selected from the group consisting of sub-stoichiometric: hafnium oxide, tantalum oxide, nickel oxide, tungsten (III) oxide, tungsten (IV) oxide, tungsten (VI) oxide, tungsten pentoxide, titanium oxide, zirconium oxide, vanadium oxide, copper (II) oxide, aluminum oxide, or a combination thereof.

Example 40

This example includes any or all of the features of example 28, wherein after execution of the forming process, the method further includes executing a reset process to break the at least one filament.

Example 41

This example includes any or all of the features of example 40, wherein after execution of the reset process, the method further includes executing a set process to reform the at least one filament.

Example 42

This example includes any or all of the features of example 28, wherein forming the cell precursor further includes providing a substrate including a dielectric material having a trench formed therein, wherein: at least a portion of the first electrode is provided in the trench; forming the switching layer precursor includes depositing the plurality of alternating oxide and oxygen reactive layers within the trench, such that first and second sides of the switching layer precursor respectively contact opposing sidewalls of the trench; and forming the second electrode includes depositing the second electrode material on the oxygen exchange layer.

Example 43

This example includes any or all of the features of example 28, wherein the second electrode material includes a conductive material that does not substantially react with oxygen.

Example 44

According to this example there is provided a resistive memory cell precursor including: a first electrode including a first electrode material; a switching layer precursor on the first electrode; and a second electrode on the switching layer precursor and including a second electrode material; wherein the switching layer precursor includes a plurality of alternating oxide and oxygen exchange layers, the oxide layer including a substantially stoichiometric oxide, the oxygen exchange layers including an oxygen reactive material; and wherein the switching layer precursor and the oxygen exchange layer are configured such that: in response to the execution of a heat treatment process, at least a portion of the substantially stoichiometric oxide is converted to a sub-stoichiometric oxide including a plurality of oxygen vacancies, and at least a portion of the oxygen reactive material is converted to reacted oxygen reactive material, the oxygen vacancies having a controlled distribution defined between a first and second surface of the switching layer precursor; and in response to the execution of a forming process, the switching layer precursor is converted to a switching layer in which at least a portion of the oxygen vacancies form a low resistance pathway between the first electrode and the second electrode.

Example 45

This example includes any or all of the features of example 44, wherein the controlled distribution is selected from the group consisting of a linear distribution, a parabolic distribution, a logarithmic distribution, a stepped distribution, a polynomial distribution, an asymptotic distribution, and combinations thereof.

Example 46

This example includes any or all of the features of example 44, wherein: the plurality of alternating oxide and oxygen exchange layers includes at least a first and second oxide layers having respective first and second oxide layer thicknesses; and the first and second oxide layer thicknesses are the same or different.

Example 47

This example includes any or all of the features of example 46, wherein: the first and second surfaces are a lower and upper surface, respectively, of the switching layer precursor; the first oxide layer is proximate the lower surface; the second oxide layer is proximate the upper surface; the first and second oxide layer thicknesses are different; and the controlled distribution is a stepped distribution.

Example 48

This example includes any or all of the features of example 47, wherein the first oxide layer thickness is less than the second oxide layer thickness.

Example 49

This example includes any or all of the features of example 47, wherein the first oxide layer thickness is greater than the second oxide layer thickness.

Example 50

This example includes any or all of the features of example 44, wherein: the plurality of alternating oxide and oxygen exchange layers includes at least a first and second oxygen exchange layers having respective first and second OEL layer thicknesses; and the first and second OEL layer thicknesses are the same or different.

Example 51

This example includes any or all of the features of example 50, wherein the first and second surfaces are a lower and upper surface, respectively, of the switching layer precursor; the first oxygen exchange layer is proximate the lower surface; the second oxygen exchange layer is proximate the upper surface; and the first and second OEL layer thicknesses are different.

Example 52

This example includes any or all of the features of example 44, wherein: the reacted oxygen reactive material is an oxide of the oxygen reactive material; and during execution of the heat treatment process, substantially all of the oxygen reactive material in the oxygen exchange layers is converted to the oxide of the oxygen reactive material.

Example 53

This example includes any or all of the features of example 52, wherein during the heat treatment process, all of the oxygen reactive material in the oxygen exchange layers is converted to the oxide of the oxygen reactive material.

Example 54

This example includes any or all of the features of example 44, wherein the sub-stoichiometric oxide is one or more sub-stoichiometric metal oxides selected from the group consisting of sub-stoichiometric: hafnium oxide, tantalum oxide, nickel oxide, tungsten (III) oxide, tungsten (IV) oxide, tungsten (VI) oxide, tungsten pentoxide, titanium oxide, zirconium oxide, vanadium oxide, copper (II) oxide, aluminum oxide, or a combination thereof.

Example 55

This example includes any or all of the features of example 44, further including a substrate including a dielectric material having a trench formed therein, wherein: at least a portion of the switching layer precursor is disposed within the trench, such that first and second sides of the switching layer precursor respectively contact opposing sidewalls of the trench.

Example 56

This example includes any or all of the features of example 44, wherein the second electrode material includes a conductive material that does not substantially react with oxygen.

Example 57

According to this example there is provided a method of forming a resistive memory cell, including: forming a cell precursor at least in part by providing a first electrode including a first electrode material; forming a switching layer precursor on the first electrode, the switching layer precursor including a substantially stoichiometric oxide; forming an oxygen exchange layer on the switching layer precursor, the oxygen exchange layer including an oxygen reactive material; forming a second electrode including a second electrode material on the switching layer precursor, wherein the second electrode material includes a conductive material that does not substantially react with oxygen; executing a heat treatment process to convert at least a portion of the substantially stoichiometric oxide to a sub-stoichiometric oxide containing a plurality of oxygen vacancies, and to convert at least a portion of the oxygen reactive material to reacted oxygen reactive material; and executing a forming process to convert the switching layer precursor to a switching layer in which the oxygen vacancies form least one filament that provides a low resistance pathway between the first electrode and the second electrode.

Example 58

This example includes any or all of the features of example 57, wherein the second electrode material is a metal nitride, a metal carbide, or a combination thereof.

Example 59

This example includes any or all of the features of example 58, wherein the second electrode material is titanium nitride or titanium carbide.

Example 60

This example includes any or all of the features of example 57, wherein forming the oxygen exchange layer includes depositing the oxygen reactive material to an OEL thickness, wherein the OEL thickness is set such that in response to the execution of the heat treatment process, substantially all of the oxygen reactive material is converted to the reacted oxygen reactive material.

Example 61

This example includes any or all of the features of example 60, wherein the OEL thickness is set such that in response to the execution of the heat treatment process, all of the oxygen reactive material is converted to the reacted oxygen reactive material.

Example 62

This example includes any or all of the features of example 57, wherein: the reacted oxygen reactive material is an oxide of the oxygen reactive material.

Example 63

This example includes any or all of the features of example 57, wherein the sub-stoichiometric oxide is one or more sub-stoichiometric metal oxides selected from the group consisting of sub-stoichiometric: hafnium oxide, tantalum oxide, nickel oxide, tungsten (III) oxide, tungsten (IV) oxide, tungsten (VI) oxide, tungsten pentoxide, titanium oxide, zirconium oxide, vanadium oxide, copper (II) oxide, aluminum oxide, or a combination thereof.

Example 64

This example includes any or all of the features of example 57, wherein after execution of the forming process, the method further includes executing a reset process to break the at least one filament.

Example 65

This example includes any or all of the features of example 64, wherein after execution of the reset process, the method further includes executing a set process to reform the at least one filament.

Example 66

This example includes any or all of the features of example 57, wherein forming the cell precursor further includes providing a substrate including a dielectric material having a trench formed therein, wherein: at least a portion of the first electrode is provided in the trench; forming the switching layer precursor includes depositing the substantially stoichiometric oxide within the trench such that first and second sides of the switching layer precursor respectively contact opposing sidewalls of the trench; forming the oxygen exchange layer includes depositing the oxygen reactive material on the switching layer precursor; and forming the second electrode includes depositing the second electrode material on the oxygen exchange layer.

Example 67

According to this example there is provided a resistive memory cell precursor including: a first electrode including a first electrode material; a switching layer precursor on the first electrode, the switching layer precursor including a substantially stoichiometric oxide; an oxygen exchange layer on the switching layer precursor, the oxygen exchange layer including an oxygen reactive material; and a second electrode including a second electrode material on the switching layer precursor, the second electrode material including a conductive material that does not substantially react with oxygen; wherein the switching layer precursor and the oxygen exchange layer are configured such that: in response to the execution of a heat treatment process, at least a portion of the substantially stoichiometric oxide is converted to a sub-stoichiometric oxide including a plurality of oxygen vacancies, and at least a portion of the oxygen reactive material is converted to reacted oxygen reactive material, the oxygen vacancies having a controlled distribution defined between a first and second surface of the switching layer precursor; and in response to the execution of a forming process, the switching layer precursor is converted to a switching layer in which at least a portion of the oxygen vacancies form a low resistance pathway between the first electrode and the second electrode.

Example 68

This example includes any or all of the features of example 67, wherein the second electrode material is a metal nitride, a metal carbide, or a combination thereof.

Example 69

This example includes any or all of the features of example 68, wherein the second electrode material is titanium nitride or titanium carbide.

Example 70

This example includes any or all of the features of example 67, wherein: the oxygen exchange layer has an OEL thickness; and the OEL thickness is set such that in response to the execution of the heat treatment process, substantially all of the oxygen reactive material is converted to the reacted oxygen reactive material.

Example 71

This example includes any or all of the features of example 70, wherein the OEL thickness is set such that in response to the execution of the heat treatment process, all of the oxygen reactive material is converted to the reacted oxygen reactive material.

Example 72

This example includes any or all of the features of example 67, wherein the reacted oxygen reactive material is an oxide of the oxygen reactive material.

Example 73

This example includes any or all of the features of example 67, wherein the sub-stoichiometric oxide is one or more sub-stoichiometric metal oxides selected from the group consisting of sub-stoichiometric: hafnium oxide, tantalum oxide, nickel oxide, tungsten (III) oxide, tungsten (IV) oxide, tungsten (VI) oxide, tungsten pentoxide, titanium oxide, zirconium oxide, vanadium oxide, copper (II) oxide, aluminum oxide, or a combination thereof.

Example 74

This example includes any or all of the features of example 67, further including a substrate including a dielectric materials having a trench formed therein, wherein: at least a portion of the switching layer precursor is disposed within the trench, such that first and second sides of the switching layer precursor respectively contact opposing sidewalls of the trench.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A resistive memory cell precursor, comprising:
    a first electrode including a first electrode material, the first electrode having opposing first and second surfaces;
    a switching layer precursor having opposing first and second surfaces, the first surface of the switching layer precursor formed directly on the first surface of the first electrode;
    an oxidized oxygen exchange layer having opposing first and second surfaces, the first surface of the oxidized oxygen exchange layer formed directly on the second surface of the switching layer precursor;
    an oxygen exchange layer having opposing first and second surfaces, the first surface of the oxygen exchange layer formed directly on the second surface of the oxidized oxygen exchange layer, the oxygen exchange layer including an oxygen reactive material; and
    a second electrode including a second electrode material, the second electrode having opposing first and second surfaces, the first surface of the second electrode formed directly on the second surface of the switching layer precursor;
    wherein the switching layer precursor comprises a sub-stoichiometric oxide and a plurality of oxygen vacancies, said oxygen vacancies distributed between the first and second surfaces of the switching layer precursor; and wherein the switching layer precursor is configured such that, in response to application of a forming voltage, said switching layer precursor converts to a switching layer in which at least a portion of said plurality of oxygen vacancies form one or more filaments, each of the one or more filaments providing a low resistance pathway between said first electrode and said second electrode.

2. A resistive memory cell precursor, comprising:

a first electrode including a first electrode material, the first electrode having opposing first and second surfaces;

a switching layer precursor having opposing first and second surfaces, the first surface of the switching layer precursor formed directly on at least a portion of the first surface of the first electrode, the switching layer precursor including a substantially stoichiometric oxide in which the mole fraction of oxygen in the oxide differs from the stoichiometric amount by less than about 0.5%;

an oxygen exchange layer having opposing first and second surfaces, the first surface of the oxygen exchange layer formed directly on at least a portion of the second surface of the switching layer precursor, the oxygen exchange layer including an oxygen reactive material; and a second electrode including a second electrode material, the second electrode having opposing first and second surface, the first surface of the second electrode formed directly on at least a portion of the second surface of the switching layer precursor, the second electrode material including a conductive material that does not react with oxygen;

wherein:

the switching layer precursor and the oxygen exchange layer are configured such that: in response to the execution of a heat treatment process, at least a portion of the substantially stoichiometric oxide is converted to a sub-stoichiometric oxide including a plurality of oxygen vacancies, and at least a portion of the oxygen reactive material is converted to reacted oxygen reactive material, the oxygen vacancies having a controlled distribution defined between a first and second surface of the switching layer precursor; and in response to the execution of a forming process, the switching layer precursor is converted to a switching layer in which at least a portion of the oxygen vacancies form a low resistance pathway between the first electrode and the second electrode.

3. The resistive memory cell precursor of claim 2 wherein the second electrode material is a metal nitride, a metal carbide, or a combination thereof.

4. The resistive memory cell precursor of claim 3 wherein the second electrode material is titanium nitride or titanium carbide.

5. The resistive memory cell precursor of claim 2, wherein: the oxygen exchange layer has an OEL thickness; and the OEL thickness is set such that in response to the execution of the heat treatment process, all of the oxygen reactive material is converted to the reacted oxygen reactive material.

6. The resistive memory cell precursor of claim 5 wherein the OEL thickness is set such that in response to the execution of the heat treatment process, all of the oxygen reactive material is converted to the reacted oxygen reactive material.

7. The resistive memory cell precursor of claim 5 wherein the reacted oxygen reactive material is an oxide of the oxygen reactive material.

8. The resistive memory cell precursor of claim 5 wherein the sub-stoichiometric oxide is one or more sub-stoichiometric metal oxides selected from the group consisting of sub-stoichiometric: hafnium oxide, tantalum oxide, nickel oxide, tungsten (III) oxide, tungsten (IV) oxide, tungsten (VI) oxide, tungsten pentoxide, titanium oxide, zirconium oxide, vanadium oxide, copper (II) oxide, aluminum oxide, or a combination thereof.

9. The resistive memory cell precursor of claim 5 further comprising:

a substrate including a dielectric material having a trench formed therein, wherein: at least a portion of the switching layer precursor is disposed within the trench, such that first and second sides of the switching layer precursor respectively contact opposing sidewalls of the trench.

* * * * *